(12) United States Patent
Ozaki et al.

(10) Patent No.: US 9,332,638 B2
(45) Date of Patent: May 3, 2016

(54) WIRING BOARD AND METHOD FOR MANUFACTURING WIRING BOARD

(75) Inventors: Kiminori Ozaki, Kariya (JP); Yasuhiro Koike, Kariya (JP); Hiroaki Asano, Kariya (JP); Harumitsu Sato, Kariya (JP); Hiroki Watanabe, Kariya (JP); Tadayoshi Kachi, Kariya (JP); Takahiro Suzuki, Kariya (JP); Hitoshi Shimadu, Kariya (JP); Tetsuya Furuta, Kariya (JP); Masao Miyake, Kariya (JP); Takahiro Hayakawa, Nagoya (JP); Tomoaki Asai, Nagoya (JP); Ryou Yamauchi, Hashima (JP)

(73) Assignee: KABUSHIKI KAISHA TOYOTA JIDOSHOKKI, Aichi-ken (JP)

( * ) Notice: Subject to any disclaimer, the term of this patent is extended or adjusted under 35 U.S.C. 154(b) by 130 days.

(21) Appl. No.: 14/118,636

(22) PCT Filed: May 23, 2012

(86) PCT No.: PCT/JP2012/063186
§ 371 (c)(1),
(2), (4) Date: Jan. 28, 2014

(87) PCT Pub. No.: WO2012/161218
PCT Pub. Date: Nov. 29, 2012

(65) Prior Publication Data
US 2014/0151106 A1 Jun. 5, 2014

(30) Foreign Application Priority Data
May 26, 2011 (JP) .................. 2011-118332

(51) Int. Cl.
*H05K 1/11* (2006.01)
*H05K 3/00* (2006.01)
(Continued)

(52) U.S. Cl.
CPC ............... *H05K 1/11* (2013.01); *H05K 3/0094* (2013.01); *H05K 3/4084* (2013.01);
(Continued)

(58) Field of Classification Search
CPC ............. H05K 1/02; H05K 1/11; H05K 3/00; H05K 3/06; H05K 3/10; H05K 3/28; H05K 3/30; H05K 3/34; H05K 3/36; H05K 3/38; H05K 3/40; H05K 3/42; H05K 3/46; H01L 21/02; H01L 21/48; H01L 23/34; H01L 23/48; H01L 23/52
USPC ............ 174/262, 255, 261, 264; 257/98, 700, 257/780; 216/18, 20; 428/131; 29/829–831, 29/852, 874
See application file for complete search history.

(56) References Cited

U.S. PATENT DOCUMENTS 4,064,357 A * 12/1977 Dixon .................. H05K 3/4084
174/262
4,769,269 A * 9/1988 Johnson ............... H05K 3/4084
428/131
(Continued)

FOREIGN PATENT DOCUMENTS

CN 1360465 A 7/2002
EP 0459831 A2 12/1991
(Continued)

OTHER PUBLICATIONS

The translation of the International Preliminary Report on Patentability dated Nov. 26, 2013, issued by the International Searching Authority in corresponding International Application No. PCT/JP2012/063186.
(Continued)

*Primary Examiner* — Xiaoliang Chen
(74) *Attorney, Agent, or Firm* — Sughrue Mion, PLLC

(57) ABSTRACT

An electrically conductive path is configured from a first copper plate, a second copper plate, and solder. The first copper plate has a first bent section extended from a first joining section joined to an electrically insulative board and bent toward the rear surface of the electrically insulative board. The second copper plate has a second bent section which is extended from a second joining section joined to the electrically insulative board, is bent toward the front surface of the electrically insulative board, and is disposed so as to cover, together with the first bent section, the inner wall surface of a base-material through-hole. Through-holes are provided in the portions of the second copper plate which face the inside of the base-material through-hole. Solder is filled between the first bent section and the second bent section.

5 Claims, 17 Drawing Sheets

(51) Int. Cl.
*H05K 3/40* (2006.01)
*H05K 1/02* (2006.01)

(52) U.S. Cl.
CPC ............ *H05K 1/0263* (2013.01); *H05K 1/115* (2013.01); *H05K 3/4038* (2013.01); *H05K 3/4046* (2013.01); *H05K 2201/0305* (2013.01); *H05K 2201/0969* (2013.01); *H05K 2201/09509* (2013.01); *H05K 2203/033* (2013.01); *H05K 2203/1178* (2013.01); *Y10T 29/49165* (2015.01)

(56) References Cited

U.S. PATENT DOCUMENTS

| | | | | |
|---|---|---|---|---|
| 5,281,770 | A * | 1/1994 | Kamei | H01R 9/091 174/261 |
| 5,378,314 | A * | 1/1995 | Schmidt | H05K 1/115 216/18 |
| 5,433,819 | A * | 7/1995 | McMeen | H05K 3/281 216/105 |
| 5,436,062 | A | 7/1995 | Schmidt et al. | |
| 6,528,874 | B1 * | 3/2003 | Iijima | H01L 21/4857 174/261 |
| 8,884,448 | B2 * | 11/2014 | Kwon | H01L 23/49816 257/737 |
| 2001/0022236 | A1 * | 9/2001 | Stolze | H01L 21/486 174/255 |
| 2003/0143833 | A1 * | 7/2003 | Iijima | H01L 21/4857 438/622 |
| 2003/0151067 | A1 * | 8/2003 | Iijima | H01L 21/4857 257/200 |
| 2004/0197962 | A1 * | 10/2004 | Iijima | H01L 21/4857 438/125 |
| 2005/0039946 | A1 * | 2/2005 | Nakao | H05K 1/0218 174/255 |
| 2006/0236534 | A1 * | 10/2006 | Ichikawa | H05K 3/403 29/852 |
| 2006/0258139 | A1 * | 11/2006 | Iijima | H01L 21/4857 438/612 |
| 2007/0209199 | A1 * | 9/2007 | Iijima | H01L 21/4857 29/836 |
| 2009/0197437 | A1 * | 8/2009 | Ouchi | H05K 3/326 439/68 |
| 2010/0064512 | A1 * | 3/2010 | Kariya | H05K 1/162 29/834 |
| 2010/0243638 | A1 * | 9/2010 | Niederer | H01R 9/091 219/542 |
| 2011/0079811 | A1 * | 4/2011 | Lin | H01L 33/642 257/98 |
| 2011/0154658 | A1 * | 6/2011 | Chuang | H05K 3/0097 29/829 |

FOREIGN PATENT DOCUMENTS

| | | |
|---|---|---|
| EP | 0600052 | 6/1994 |
| FR | 2439322 | 5/1980 |
| GB | 2036624 A | 7/1980 |
| GB | 2058233 A | 4/1982 |
| GB | 2085233 A | 4/1982 |
| JP | 54-156167 A | 12/1979 |
| JP | 55-11174 Y2 | 3/1980 |
| JP | 10-126013 A1 | 5/1998 |
| JP | 2001-284800 A | 10/2001 |
| JP | 2006-093577 A | 4/2006 |
| JP | 2010-267649 A | 11/2010 |
| WO | 9326144 | 12/1993 |

OTHER PUBLICATIONS

"Via Filling Method for Injection Molded Boards" IBM Technical Disclosure Bulletin, International Business Machines Corp. (Th0rnw00d), US, vol. 32, No. 5B, Oct. 1, 1989 pp. 112-113.
Communication dated Mar. 25, 2015, issued by the European Patent Office in counterpart Application No. 12789574.6.
Communication dated Dec. 3, 2015 from the Intellectual Property Office of the P.R. China issued in corresponding Chinese Application No. 201280024409.6.

* cited by examiner

WIRING BOARD AND METHOD FOR MANUFACTURING WIRING BOARD

This application is a National Stage of International Application No. PCT/JP2012/063186 filed May 23, 2012, claiming priority based on Japanese Patent Application No. 2011-118332 filed May 26, 2011, the contents of all of which are incorporated herein by reference in their entirety.

TECHNICAL FIELD

The present invention relates to a wiring board and a method for manufacturing a wiring board.

BACKGROUND ART

Generally, interlayer connection is achieved in a substrate by performing copper plating. For example, as shown in FIG. 19, in an insulative substrate 300, a surface layer 301 (e.g., copper foil) and a surface layer 302 (e.g., copper foil) are connected by a copper plating layer 304 formed on an inner wall surface of a through hole 303. When the interlayer connection was performed with such typical copper plating, a large current (e.g., 120 amperes) cannot flow to the copper plating layer 304.

Patent document 1 discloses technology that allows for the flow of a large current. More specifically, in a printed wiring board, current through holes, which extend from a front side to a rear side of a substrate, are arranged in a concentrated manner. This allows for the flow of a large current of 50 to 180 amperes without using a bus bar.

PRIOR ART DOCUMENT

Patent Document

Patent Document 1: Japanese Laid-Open Patent Publication No. 2010-267649

SUMMARY OF THE INVENTION

In the structure of FIG. 19, a large current (e.g., 120 amperes) cannot flow through the copper plating layer 304. Thus, referring to FIG. 20, a copper plating layer 305 having an increased thickness may be formed by extending the plating time. However, this would raise the surface of the substrate by ΔH. In a subsequent process, this would cause difficulties when mounting electronic components and when applying solder.

It is an object of the present invention to provide a wiring board and a method for manufacturing a wiring board that allow for a large current to flow through a conductive line connecting a metal plate on a front surface and a metal plate on a rear surface, while allowing for a decrease in the amount of conductive material forming the conductive line.

To achieve the above object, a first aspect of the present invention is a wiring board provided with a base including a front surface, a rear surface, and a side surface. A first metal plate is joined with the front surface. A second metal plate is joined with the rear surface. A conductive line is configured to electrically connect the first metal plate and the second metal plate. The conductive line is arranged in an inner space defined by an inner wall surface of a base through hole formed in the base or an outer space located at an outer side of the side surface of the base. The conductive line includes the first metal plate, the second metal plate, and a conductive material electrically connecting the first metal plate and the second metal plate. At least one of the first metal plate and the second metal plate includes a joined portion, which is joined with the base, and a bent portion, which is bent and extended from the joined portion to cover the inner wall surface or the side surface. The conductive material fills an inner side of the bent portion.

In the above structure, at least one of the first metal plate and the second metal plate includes a joined portion, which is joined with the base, and a bent portion, which is bent and extended from the joined portion to cover the inner wall surface or the side surface. The conductive material fills an inner side of the bent portion.

The conductive line includes the first metal plate, which is joined with the front surface, the second metal plate, which is joined with the rear surface, and the conductive line, which electrically connects the first metal plate and the second metal plate. The conductive line electrically connects the first metal plate and the second metal plate in an inner space of a base through hole extending through the base or an outer space located at an outer side of the side surface of the base. This allows for a large current to flow through the conductive line connecting the first metal plate and the second metal plate. Further, the conductive material is filled in the space having a reduced size. This decreases the amount of the filled constructive material.

Preferably, the first metal plate includes a first joined portion, which serves as the joined portion, and a first bent portion, which serves as the bent portion. The first bent portion is bent toward the rear surface. The second metal plate includes a second joined portion, which serves as the joined portion, and a second bent portion, which serves as the bent portion. The second bent portion is bent toward the front surface to cover the inner wall surface or the side surface together with the first bent portion. The conductive material is filled between the first bent portion and the second bent portion.

The above structure allows for a large current to flow through the conductive line connecting the first metal plate and the second metal plate. The portion where the conductive material is filled is between the first bent portion, which is bent toward the rear surface of the base, and the second bent portion, which is bent toward the front surface of the substrate. The first bent portion and the second bent portion are bent toward the base. Thus, after the conductive material melts, the conductive material easily flows to the lower side.

Preferably, the second metal board includes a through hole in a portion facing toward the inner space or the outer space.

In the above structure, the through hole allows for either one of the release of gas from the base through hole or the inspection of the conductive line to be performed.

Preferably, the conductive line is arranged in the inner space. The first bent portion is bent toward the inner space from an open end of the base through hole that opens in the front surface. Further, the first bent portion includes a through hole in a portion corresponding to a central portion of the base through hole. The second bent portion is bent toward the inner space from an open end of the base through hole that opens in the rear surface. Further, the second bent portion is inserted into the through hole of the first bent portion.

The above structure ensures electrical connection with the conductive line formed in the interior space of the base through hole.

Preferably, the through hole formed in the second metal plate is one of a plurality arranged on a circumference extending about a center axis of the base through hole, which has a circular cross-section.

In the above structure, the plurality of through holes arranged on a circumference extending about the center axis of the base through hole, which has a circular cross-section, ensures that the conductive line may be inspected further accurately.

Preferably, the through holes formed in the second metal plate are arranged at equal angular intervals.

In the above structure, the through holes are arranged at equal angular intervals. This ensures that the inspection of the conductive line is performed with further accuracy.

A second aspect of the present invention is a wiring board provided with a base including a front surface, a rear surface, and a base through hole, a first metal plate joined with the front surface, a second metal plate joined with the rear surface, and a conductive line arranged in an inner space of the base through hole to electrically connect the first metal plate and the second metal plate. The conductive line includes the first metal plate, the second metal plate, and a conductive material that electrically connects the first metal plate and the second metal plate. The second metal plate includes a joined portion, which is joined with the base, and an extended portion, which extends from the joined portion to an opening of the base through hole. A plate material, which includes a through hole that is in communication with the base through hole, is arranged in the inner space. The conductive material fills the through hole of the base material.

The conductive line includes the first metal plate joined with the front surface, the second metal plate joined with the rear surface, and the conductive material that electrically connects the first metal plate and the second metal plate. The conductive line electrically connects the first metal plate and the second metal plate in an inner space of the base through hole that extends through the base. This allows for a large current to flow through the conductive line connecting the first metal plate and the second metal plate. Further, the plate material arranged in the space filled with the conductive material reduces the size of the space filled with the conductive material. This allows for a decrease in the amount of the filled conductive material.

Preferably, the extended portion includes a through hole that is in communication with the through hole of the plate material.

In the above structure, the through hole in the extended portion of the second metal plate allows for either one of the release of gas from the base through hole or the inspection of the conductive line to be performed.

Preferably, the first metal plate includes a joined portion, which is joined with the base, and an extended portion, which extends from the joined portion to the opening of the base through hole. The extended portion includes a through hole that is smaller than the base through hole. The through hole of the plate material is in communication with the through hole of the first metal plate, and the conductive material is filled in the through hole of the first metal plate and the through hole of the plate material.

A third aspect of the present invention is a method for manufacturing a wiring board. The wiring board is provided with a base including a front surface, a rear surface, and a side surface, a first metal plate joined with the front surface, a second metal plate joined with the rear surface, and a conductive line configured to electrically connect the first metal plate and the second metal plate. The conductive line is arranged in an inner space defined by an inner wall surface of a base through hole formed in the base, and the conductive line includes the first metal plate, the second metal plate, and a conductive material electrically connecting the first metal plate and the second metal plate. At least one of the first metal plate and the second metal plate includes a joined portion, which is joined with the base, and a bent portion, which is bent and extended from the joined portion to cover the inner wall surface. The method include the steps of joining the first metal plate with the front surface, joining the second metal plate with the rear surface to close one open end of the base through hole, applying solder paste to a front surface of the first metal plate at a portion corresponding to the other open end of the base through hole, forming a through hole in the second metal plate at a portion facing the inner space, and performing a reflow process on the solder paste to fill solder, which serves as the conductive material, into a space formed by the through hole and an inner side of the bent portion while removing gas from the through hole of the second metal plate.

In the above configuration, in the metal plate joining step, the first metal plate is joined with the front surface of the base, and the second metal plate is joined with the rear surface to close one open end of the base through hole. In the application step, solder paste is applied to the front surface of the first metal plate at a portion corresponding to the other open end of the base through hole. In the reflow process step, a reflow process is performed on the solder paste to fill solder, which serves as the conductive material, in an inner side of the bent portion while removing gas from the through hole formed in the second metal plate at a portion facing the inner space of the base.

This allows for the wiring board of claim 1 to be obtained. In the reflow step performed when manufacturing the wiring board, gas is released from the base through hole. This stabilizes the solder wettability.

A fourth aspect of the present invention is a method for manufacturing a wiring board. The wiring board is provided with a base including a front surface, a rear surface, and a side surface, a first metal plate joined with the front surface, a second metal plate joined with the rear surface, and a conductive line configured to electrically connect the first metal plate and the second metal plate. The conductive line is arranged in an inner space defined by an inner wall surface of a base through hole formed in the base. The conductive line includes the first metal plate, the second metal plate, and a conductive material electrically connecting the first metal plate and the second metal plate. The method includes the steps of arranging the second metal plate that includes a through hole on the rear surface, wherein the through hole of the second metal plate is in communication with the base through hole and has a smaller opening area than the base through hole, arranging a plate material that includes a through hole in the base through hole, wherein the through hole of the plate material is in communication with the through hole of the second metal plate and has a larger opening area than the through hole of the second metal plate, arranging the first metal plate that includes a through hole on the front surface, wherein the through hole of the first metal plate is in communication with the through hole of the plate material, and filling a space formed by the through hole of the second metal plate, the through hole of the first metal plate, and the through hole of the plate material with solder, which serves as the conductive material.

In the above configuration, in the second metal plate arranging step, the second metal plate, which includes a through hole having a smaller opening area than the base through hole and which is in communication with the base through hole, is arranged on the rear surface of the base. In the first metal plate arranging step, the first metal plate, which includes a through hole that is in communication with the through hole of the plate material, is arranged on the front surface of the base. In the filling step, an inner space of the through hole of the first metal plate and the through hole of the plate material including the through hole of the second metal plate is filled with solder, which serves as the conductive material.

The above configuration allows for the wiring board of the second embodiment to be obtained.

Effect of the Invention

The present invention allows for a large current to flow through a conductive line connecting the front and rear sides, and allow for a decrease in the amount of the conductive material forming the conductive line.

DETAILED DESCRIPTION OF THE PREFERRED EMBODIMENTS

First Embodiment

A first embodiment of the present invention will now be described with reference to the drawings.

Figure 1:
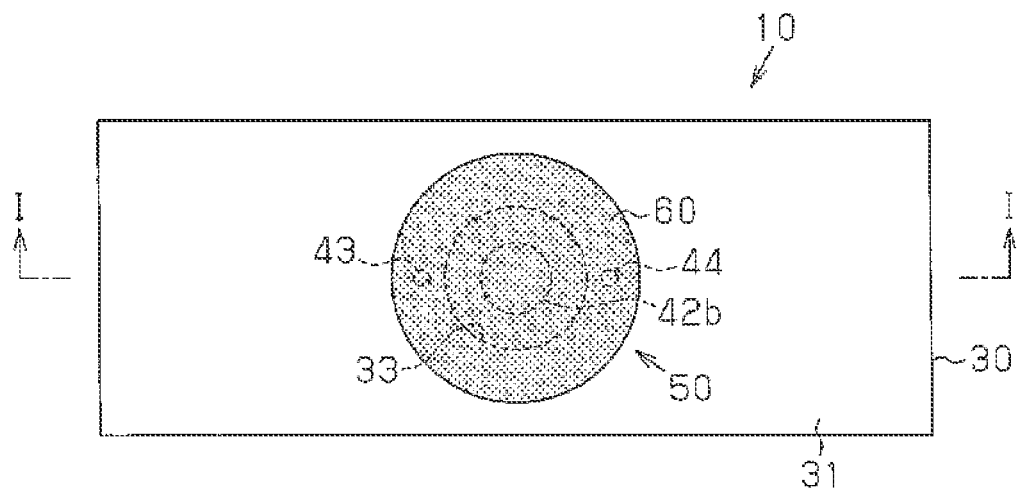
FIG. 1(a) is a plan view of a wiring board according to a first embodiment of the present invention.
FIG. 1(b) is a cross-sectional view taken along line I-I in FIG. 1(a)
FIG. 1(c) is a bottom view of the wiring board.
Figure 1:
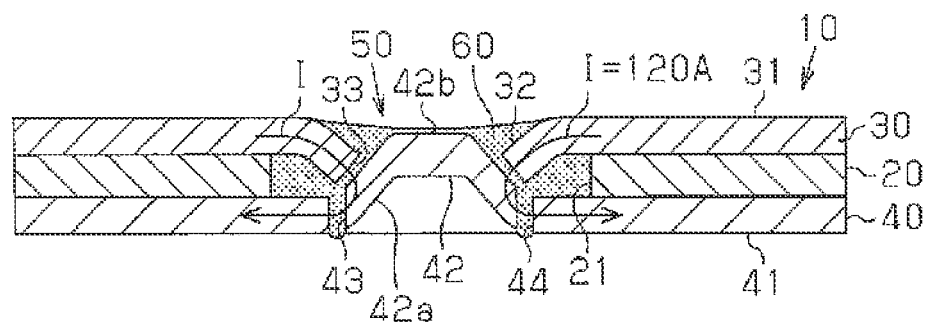
Figure 1:
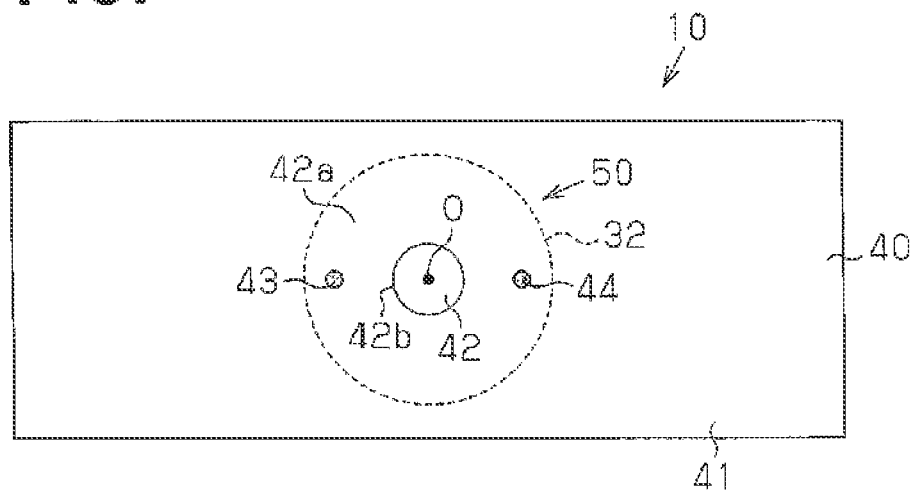

Referring to FIG. 1, a wiring board 10 is formed by a thick copper substrate. That is, a first copper plate 30, which serves as a first metal plate, is adhered to an upper surface of an insulative substrate 20, which serves as a base. Further, a second copper plate 40, which serves as a second metal plate, is adhered to a lower surface of the insulative substrate 20. The first copper plate 30 is patterned into a desired shaped to form a current line. Further, the second copper plate 40 is patterned into a desired shaped to form a current line.

More specifically, for example, a glass epoxy resin substrate may be used as the insulative substrate 20. The insulative substrate 20 has a thickness of, for example, 400 μm, the first copper plate 30 has a thickness of, for example, 500 μm, and the second copper plate 40 has a thickness of, for example, 500 μm.

The configuration described below electrically connects a conductive pattern formed by the first copper plate 30 and a conductive pattern formed by the second copper plate 40.

In the wiring board 10, a base through hole 21 extends through the insulative substrate 20. A conductive line 50 connects the first copper plate 30, which is joined with the front surface (upper surface) of the insulative substrate 20, and the second copper plate 40, which is joined with the rear surface (lower surface) of the insulative substrate 20. The base through hole 21 is circular.

The conductive line 50 includes the first copper plate 30, the second copper plate 40, and solder 60, which serves as a conductive material electrically connecting the first copper plate 30 and the second copper plate 40.

The first copper plate 30 includes a first bent portion 32. The first bent portion 32 extends from a first joined portion 31 and is bent toward the rear side (lower side) of the insulative substrate 20. In detail, the first bent portion 32 is bent into the base through hole 21 from the open end of the base through hole 21 in the front side (upper side) of the insulative substrate 20. The first bent portion 32 extends straight and diagonally downward from the opening of the base through hole 21. A through hole 33 is formed in the first bent portion 32 at a location corresponding to the central portion of the base through hole 21. The through hole 33 is circular.

Two through holes 43 and 44 are formed in the second copper plate 40. The second copper plate 40 includes a second bent portion 42, and the second bent portion 42 extends from a second joined portion 41. The second bent portion 42 is formed at a location corresponding to the central portion of the base through hole 21. The second bent portion 42 includes a diagonal section 42a and a horizontal section 42b. The second bent portion 42 is bent toward the front side (upper side) of the insulative substrate 20 and arranged to cover the inner wall surface of the base through hole 21 with the first bent portion 32. In detail, the diagonal section 42a of the second bent portion 42 is bent to extend straight and diagonally upward into the base through hole 21 from the opening of the base through hole 21 in the rear side (lower side) of the insulative substrate. Further, the diagonal section 42 is inserted into the through hole 33. The horizontal section 42b is located at the distal end of the diagonal section 42a. The horizontal section 42b is circular as viewed from above, and the upper surface of the horizontal section 42b is horizontal. The upper surface of the horizontal section is slightly lower than the upper surface of the wiring board 10 (upper surface of the first copper plate 30).

The through holes 43 and 44 are located in the base through hole 21 of the second copper plate 40. In detail, the through holes 43 and 44 are formed in the second copper plate 40 between the periphery of the opening of the base through hole 21 and the basal end of the second bent portion 42. In further detail, the through holes 43 and 44 are formed in the second copper plate 40 at locations proximal to the diagonal section 42a. The two through holes 43 and 44 are arranged along a circumference extending about the center O of the circular base through hole 21. The through holes (43 and 44) are arranged at equal angular intervals. The through holes 43 and 44 are circular.

A space between the first bent portion 32 and the second bent portion 42 including the interior of the through holes 43 and 44 are filled with solder 60. The through holes 43 and 44 allow for the filled solder 60 to be visible. Thus, the through holes 43 and 44 ensure the filling of the solder 60.

The operation of the wiring board 10 will now be described.

In FIG. 1, the first copper plate 30 is joined with the front surface of the insulative substrate 20, and the second copper plate 40 is joined with the rear surface of the insulative substrate 20. The solder 60 fills the space between the first bent portion 32 and the second bent portion 42. The solder 60 electrically connects the first copper plate 30 and the second copper plate 40 to each other.

Current I flows from the first copper plate 30 to the second copper plate 40. In detail, current flows from the first bent portion 32 via the solder 60 to the second bent portion 42. Here, the flow of a large current (e.g., 120 amperes) is allowed.

In this manner, by devising the shapes of the copper plates 30 and 40 at the two surfaces and performing soldering, a large current (e.g., 120 amperes) may flow between layers.

A process for manufacturing the wiring board 10 will now be described.

Figure 2A:
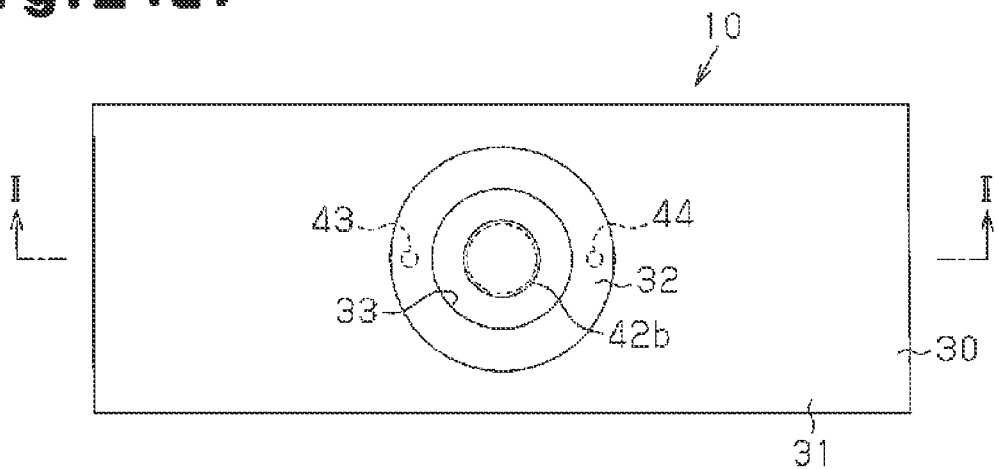
FIG. 2(a) is a plan view of the wiring board illustrating a manufacturing process for the wiring board of FIG. 1(a)
Figure 2B:
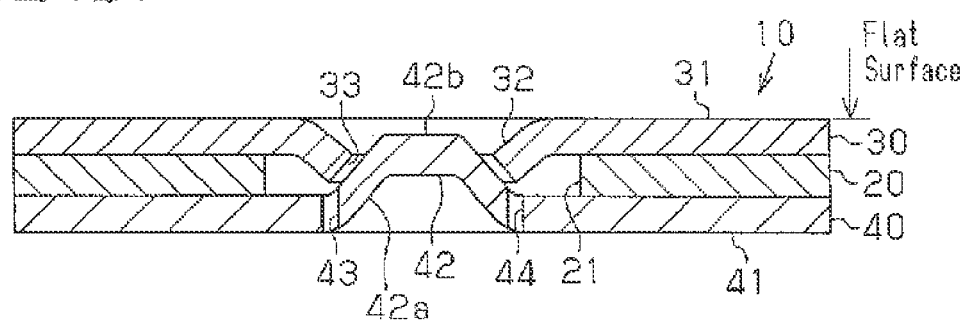
FIG. 2(b) is a cross-sectional view taken along line II-II in FIG. 2(a)
Figure 2C:
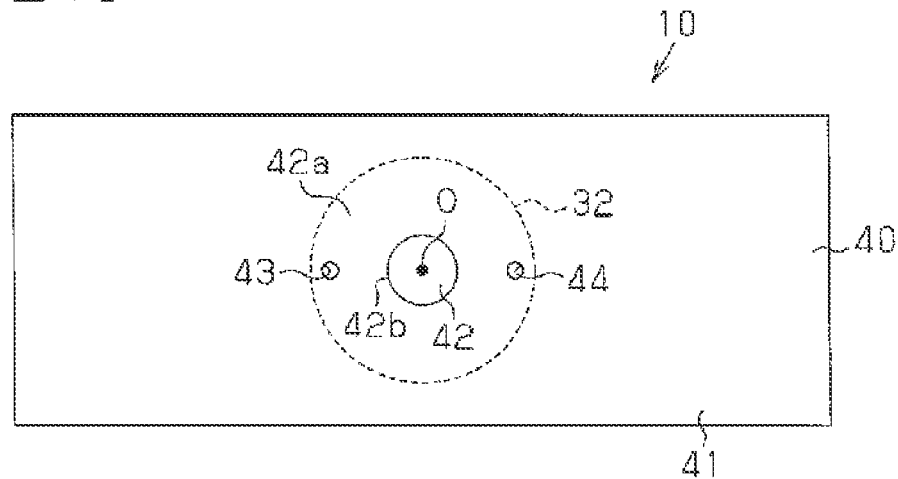
FIG. 2(c) is a bottom view of the wiring board.

Referring to FIG. 2, the insulative substrate 20, the first copper plate 30, and the second copper plate 40 are first prepared. Here, the base through hole 21 is formed in the insulative substrate 20. Further, the first bent portion 32 is formed in the first copper plate 30. The second bent portion 42 is formed in the second copper plate 40.

Then, the first copper plate 30 is adhered to the upper surface of the insulative substrate 20, and the second copper plate 40 is adhered to the lower surface of the insulative substrate 20. Here, the first bent portion 32 of the first copper plate 30 is positioned in the base through hole 21 of the insulative substrate 20. Further, the second bent portion 42 of the second copper plate 40 is arranged in the base through hole 21 of the insulative substrate 20 so as to cover the inner wall surface of the base through hole 21 with the first bent portion 32. A gap is formed between the first bent portion 32 and the second bent portion 42, and the gap serves as the space filled by the solder 60.

Figure 3A:
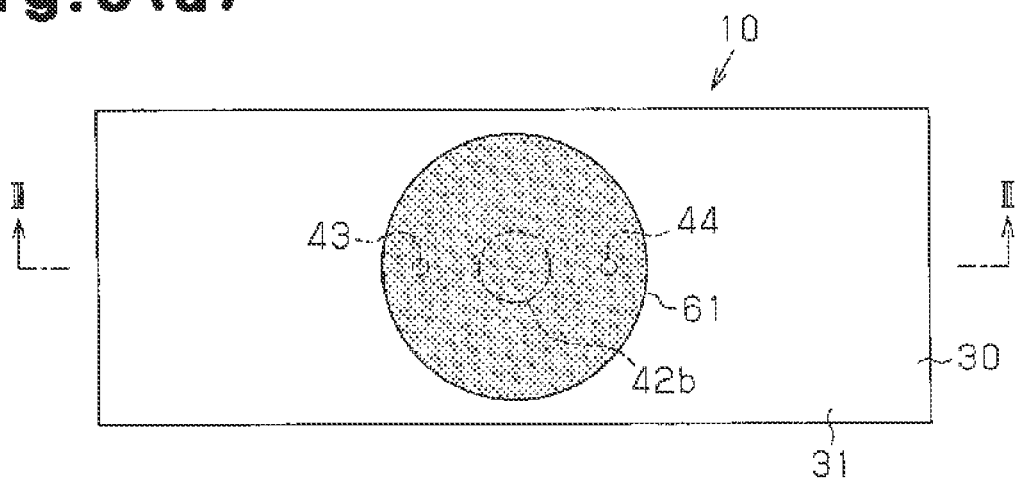
FIG. 3(a) is a plan view of the wiring board illustrating a manufacturing process for the wiring board of FIG. 1.
Figure 3B:
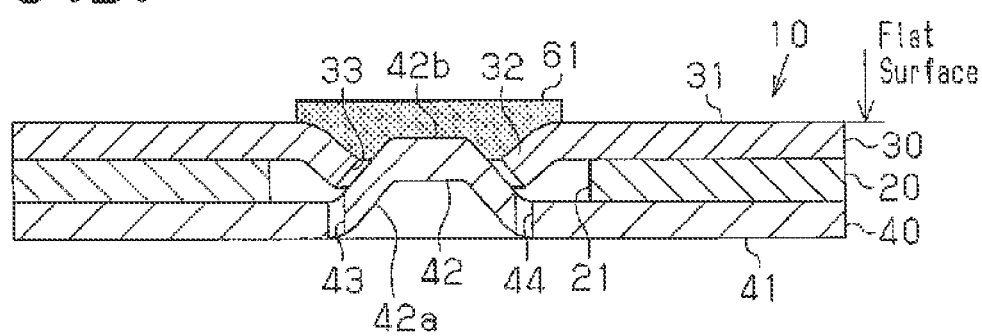
FIG. 3(b) is a cross-sectional view taken along line III-III in FIG. 3(a)
Figure 3C:
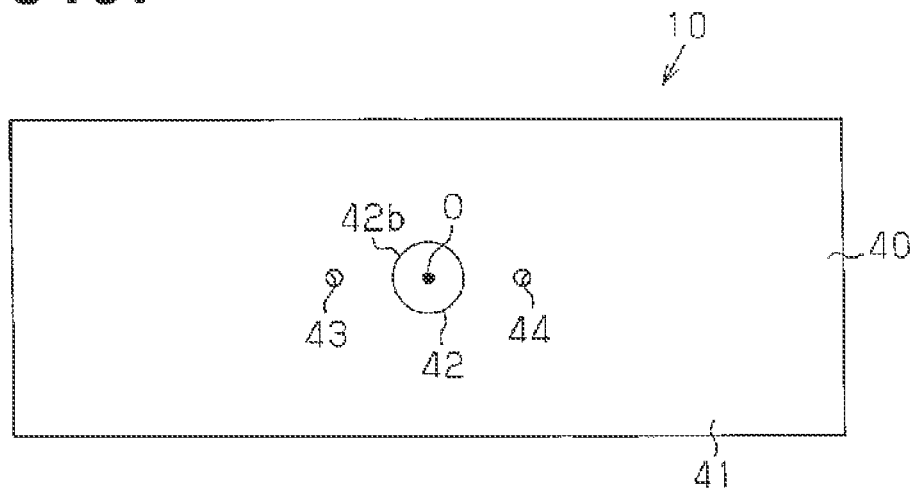
FIG. 3(c) is a bottom view of the wiring board.

Subsequently, as shown in FIG. 3, solder paste 61 is applied to the first copper plate 30 at the region where the through hole 33 is formed (on horizontal section 42b of the second bent portion 42) and its surrounding. The application of the solder paste 61 is performed under a situation in which a metal mask covers a region excluding the application region of the solder paste 61 in the base through hole 21. Specifically, the wiring board 10 has a flat upper surface that forms a copper plate surface free of projections thereby allowing for the printing of solder paste to the desired region. Further, during a solder paste application process, in addition to the double-surface connection portion of the wiring board 10 (base through hole 21), solder paste may also be applied to a region where surface-mounted components are arranged.

Then, heating is performed in a solder reflow furnace so that fluid solder flows into between the first bent portion 32 and the second bent portion 42 below the application region of the solder paste 61 thereby filling the space between the first bent portion 32 and the second bent portion 42. The solder 60 is also filled into the through holes 43 and 44.

By visually checking the solder 60 filled in the through holes 43 and 44 from the rear surface (lower surface), it may be recognized that the space between the first bent portion 32 and the second bent portion 42 is sufficiently filled by the reflow process. This allows for determination of whether or not soldering has been correctly performed. Specifically, the second copper plate 40 has a reddish black color, and the solder 60 has a silver color. This allows for the two to be easily distinguished thereby ensuring connection.

Figure 4A:
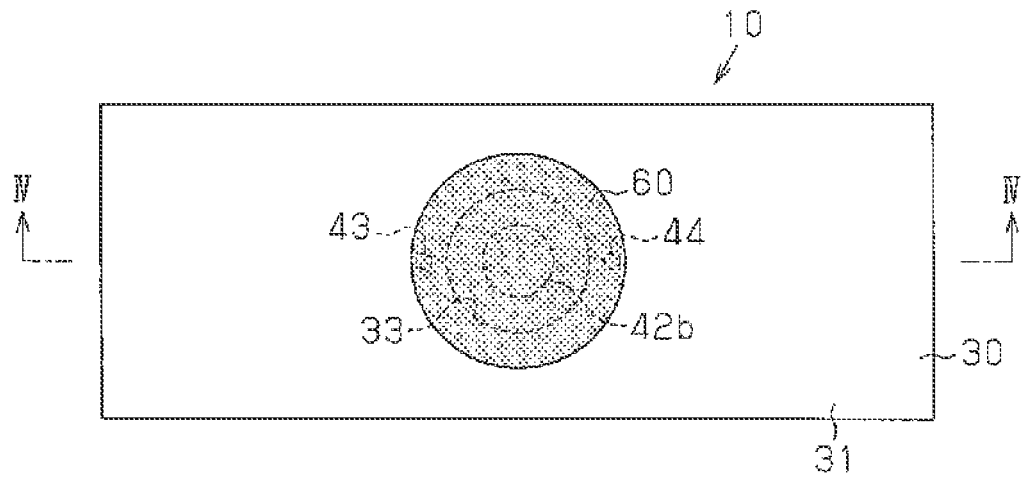
FIG. 4(a) is a plan view of the wiring board illustrating a manufacturing process for the wiring board of FIG. 1.
Figure 4B:
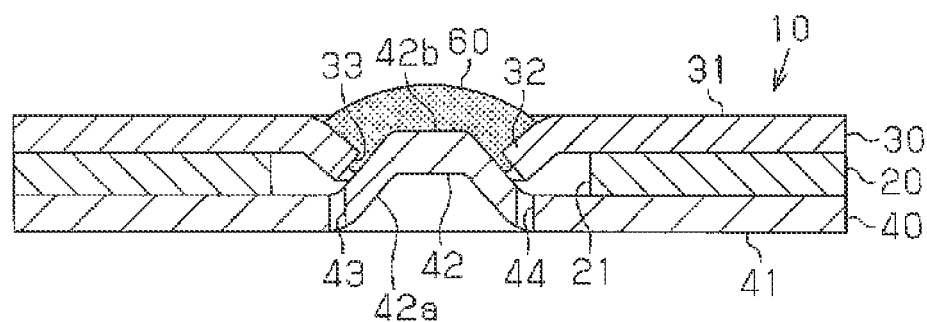
FIG. 4(b) is a cross-sectional view taken along line IV-IV in FIG. 4(a)
Figure 4C:
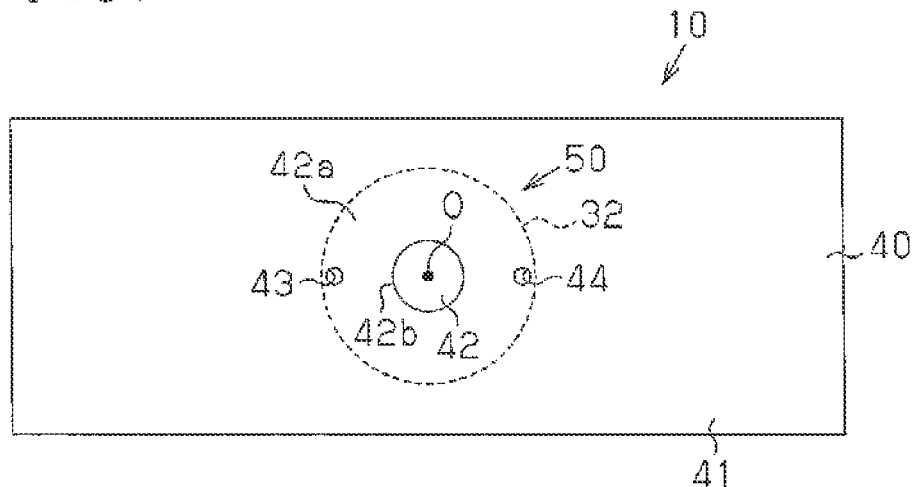
FIG. 4(c) is a bottom view of the wiring board.

FIG. 4 shows a case in which the solder 60 is not filled in the through holes 43 and 44 when filling the solder 60 between the first bent portion 32 and the second bent portion 42. In this case, the solder 60 cannot be visually checked through the through holes 43 and 44. This indicates that the soldering is defective and that the solder melted in the solder reflow process has not spread sufficiently. That is, the connection cannot be ensured. Factors that cause such a defect include, for example, low reflow temperature, short reflow time, and oxidation of the copper plate surface obstructing the spreading of solder.

The through holes (43 and 44) for confirming soldering are prepared in this manner. This allows for the solder wettability to be checked during a shipment inspection.

More specifically, the through holes 43 and 44 are formed in the lower second copper plate 40. When the solder paste 61 is applied to the upper first copper plate 30, the filling of the solder 60 may be visually checked from the through holes 43 and 44 of the lower second copper plate 40. That is, the filling of the solder 60 may be confirmed.

The present embodiment has the advantages described below.

(1) The conductive line 50 is formed by the first copper plate 30, the second copper plate 40, and the solder 60 electrically connecting the first copper plate 30 and the second copper plate 40. The conductive line 50 electrically connects the front surface and the rear surface inside the base through hole 21. This allows for a large current to flow through the conductive line 50 connecting the front and rear sides.

A detailed description will now be given.

Figure 20:
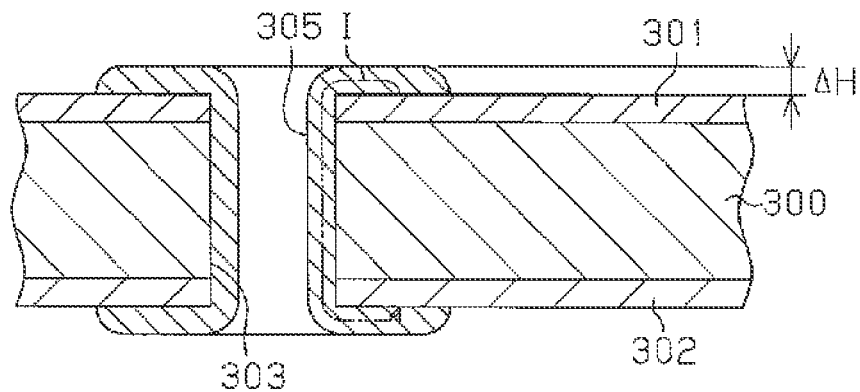
FIG. 20 is a cross-sectional view of a prior art wiring board.

As shown in FIG. 20, when the plating time is extended to form a thick copper plating layer 305 thereby allowing for the flow of a large current (e.g., 120 amperes), the surface of the substrate would be raised by ΔH, and the mounting of electronic components on the substrate surface and the application of solder in a subsequent process would be difficult. In this respect, the present embodiment allows the substrate surface to be flat and facilitates the mounting of electronic components on the substrate surface. Further, the plating time does not have to be extended, and increases in the substrate cost may be avoided.

Further, the solder 60, which serves as a conductive material, is filled in the inner sides of the bent portions 32 and 42. This reduces the size of the space filled by the solder 60 and allows for a decrease in the amount of the filled solder 60. The "inner sides of the bent portions 32 and 42" correspond to the space between the first copper plate 30 and the second copper plate 40 that form a conductive line. In the first embodiment, the "inner sides of the bent portions 32 and 42" corresponds to the space between the first bent portion 32 and the second bent portion 42.

Further, the first copper plate 30, which serves as the first metal plate, extends from the first joined portion 31, which is joined with the insulative substrate 20 that serves as the base, and includes the first bent portion 32, which is bent toward the rear side of the insulative substrate 20. The second copper plate 40, which serves as a second metal plate, extends from the second joined portion 41, which is joined with the insulative substrate 20, and includes the second bent portion 42, which is bent toward the front side of the insulative substrate 20 and which covers the inner wall surface of the base through hole 21 with the first bent portion 32. The solder 60, which serves as the conductive material, is filled between the first bent portion 32 and the second bent portion 42. The location filled by the solder 60 serving as the conductive material (where the solder 60 is applied) is between the first bent portion 32, which is bent toward the rear side of the insulative substrate 20, and the second bent portion 42, which is bent toward the front side of the insulative substrate 20, and is bent toward the insulative substrate 20. Thus, the solder 60, after melting, easily flows toward the lower side.

The through holes 43 and 44 are formed in the second copper plate 40 at locations facing the interior of the base through hole 21. This allows for the conductive line 50 to be inspected through the through holes 43 and 44. That is, the through holes 43 and 44 allows for the filling of the solder 60 between the first bent portion 32 and the second bent portion 42 to be visually checked. Thus, the filling of the solder 60, which serves as the conductive material, in the portion forming a current line through which a large current flows may be checked.

(2) The first bent portion 32 includes the through hole 33 that is bent into the base through hole 21 from the opening of the base through hole 21 at the front side of the insulative substrate 20 and formed at a location corresponding to the central portion of the base through hole 21. Further, the second bent portion 42 is bent into the base through hole 21 from the opening of the base through hole 21 in the rear side of the insulative substrate 20 and inserted into the through hole 33 of the first bent portion 32. Thus, the conductive line 50 formed in the base through hole 21 may be used to ensure electric connection.

(3) The through holes (43 and 44) formed in the second copper plate 40 are arranged along a circumference extending about the center O of the circular base through hole 21. This further ensures accurate inspection of the conductive line 50.

(4) The through holes (43 and 44) formed in the second copper plate 40 are arranged at equal angular intervals. This further ensures accurate inspection of the conductive line 50.

(5) Preferably, the wiring board 10 (thick copper substrate) of the present embodiment is used in an electric vehicle, a hybrid vehicle, and a train. The same applies to the wiring board (thick copper substrate) of the other embodiments.

Second Embodiment

A second embodiment will now be described centering on differences from the first embodiment.

Figure 5A:
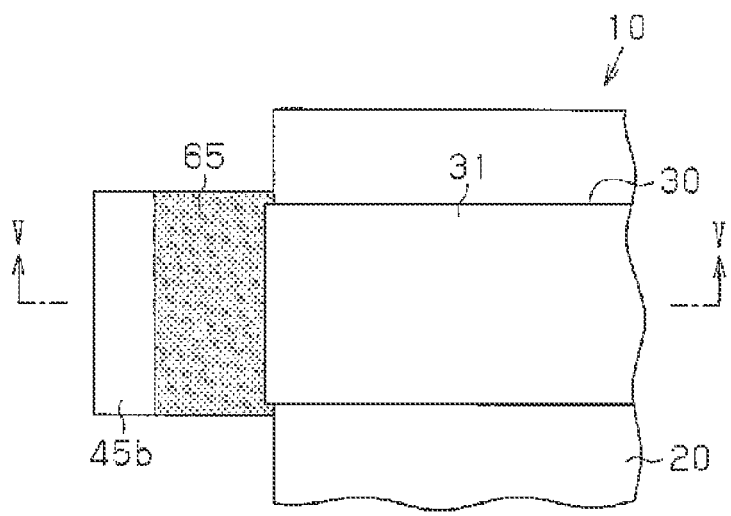
FIG. 5(a) is a plan view of a wiring board according to a second embodiment of the present invention.
Figure 5B:
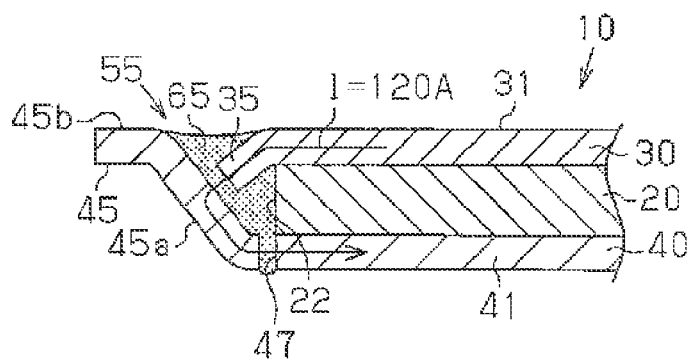
FIG. 5(b) is a cross-sectional view taken along line V-V in FIG. 5(a)
Figure 5C:
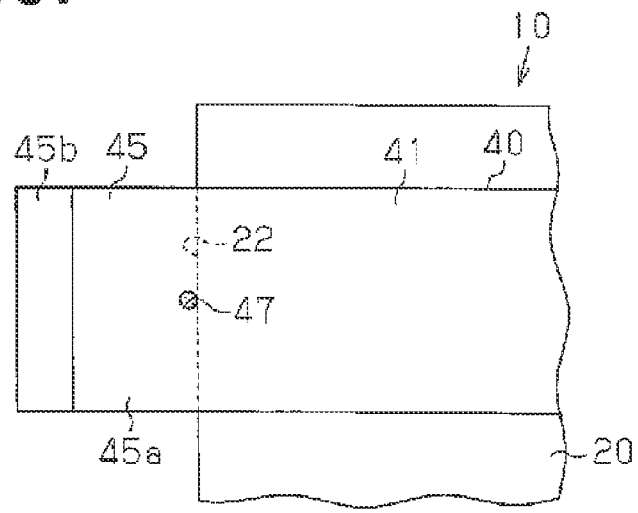
FIG. 5(c) is a bottom view of the wiring board.

FIG. 1 illustrates a wiring board on which a conductive line electrically connects the first copper plate 30 and the second copper plate 40 in the base through hole 21. In the present embodiment, as shown in FIG. 5, a conductive line 55 is formed to electrically connect the first copper plate 30 and the second copper plate 40 beside the insulative substrate 20. The conductive line 55 includes the first copper plate 30, the second copper plate 40, and solder 65 that serves as a conductive material and electrically connects the first copper plate 30 and the second copper plate 40.

The first copper plate 30 extends from the first joined portion 31, which is joined with the insulative substrate 20, and includes a first bent portion 35, which is bent toward the rear side (lower side) of the insulative substrate 20. The first bent portion 35 extends straight and diagonally downward from a side surface 22 of the insulative substrate 20. The second copper plate 40 extends from the second joined portion 41, which is joined with the insulative substrate 20, and includes a second bent portion 45, which is bent toward the front side (upper side) of the insulative substrate 20. The first bent portion 35 extends straight and diagonally downward from a side surface 22 of the insulative substrate 20 and is arranged to cover the side surface 22 of the insulative substrate 20 with the first bent portion 32.

The second bent portion 45 includes a diagonal section 45*a* and a horizontal section 45*b*. The diagonal section 45*a* of the second bent portion 42 extends straight and diagonally upward. Further, the horizontal section 45*b* of the second bent portion 45 extends in the horizontal direction from the upper end of the diagonal section 45*a*. The upper surface of the horizontal section 45*b* and the upper surface of the wiring board 10 (upper surface of the first copper plate 30) are located at the same height (flush).

The second copper plate 40 includes a through hole 47 facing a location beside the insulative substrate 20. In detail, as shown in FIG. 5(*c*), the through hole 47 is formed at a location substantially adjacent to the side surface 22 of the insulative substrate 20. As shown in FIG. 5(*c*), the through hole 47 is formed in the center of the second copper plate 40 in the widthwise direction. The through hole 47 is circular.

The solder 65 is filled between the first bent portion 35 and the second bent portion 45 including the interior of the through hole 47.

A process for manufacturing the wiring board 10 will now be described.

Figure 6A:
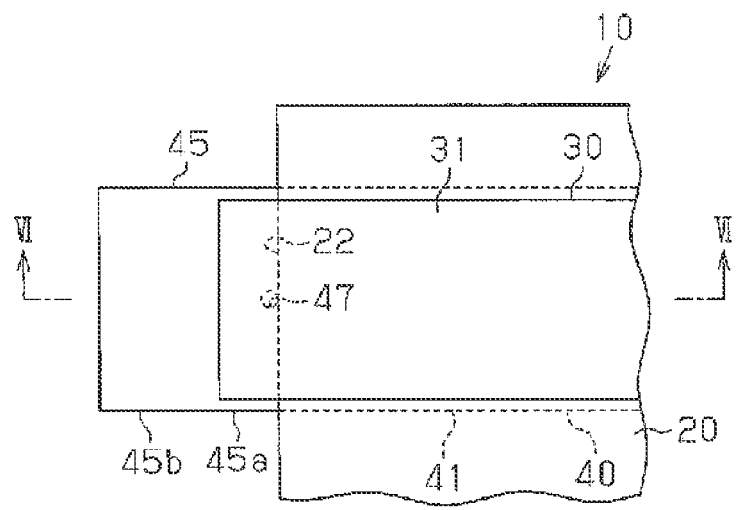
FIG. 6(a) is a plan view of the wiring board illustrating a manufacturing process for the wiring board of FIG. 5(a)
Figure 6B:
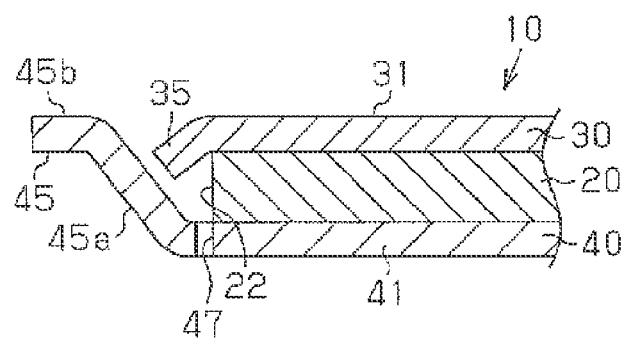
FIG. 6(b) is a cross-sectional view taken along line VI-VI in FIG. 6(a)
Figure 6C:
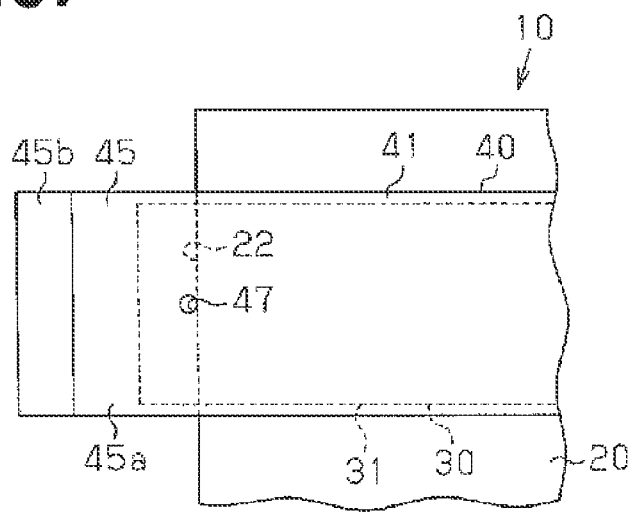
FIG. 6(c) is a bottom view of the wiring board.

Referring to FIG. 6, the insulative substrate 20, the first copper plate 30, and the second copper plate 40 are first prepared. The first bent portion 35 is formed in the first copper plate 30. Further, the second bent portion 45 is formed in the second copper plate 40.

Then, the first copper plate 30 is adhered to the upper surface of the insulative substrate 20, and the second copper plate 40 is adhered to the lower surface of the insulative substrate 20. Here, the first bent portion 32 of the first copper plate 30 is positioned at where the side surface 22 of the insulative substrate 20 is located. Further, the second bent portion 45 of the second copper plate 40 is arranged at where the side surface 22 of the insulative substrate 20 is located so as to cover the side surface 22 of the insulative substrate 20 with the first bent portion 35. A gap is formed between the first bent portion 35 and the second bent portion 45, and the gap serves as the space filled by the solder 65.

Figure 7A:
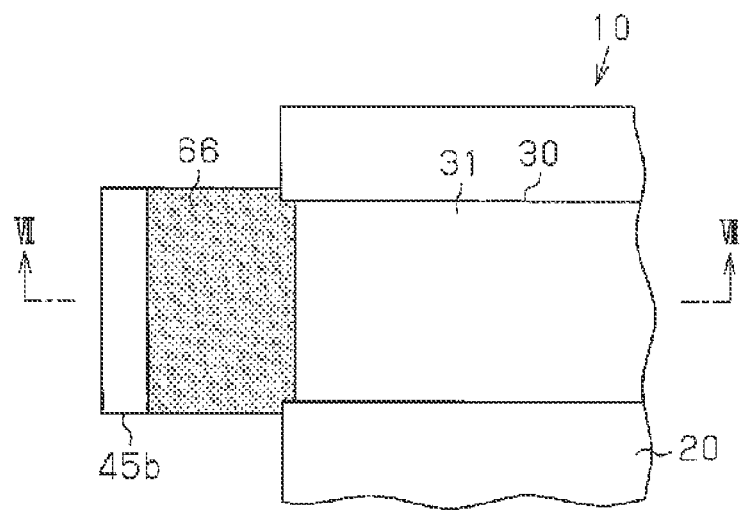
FIG. 7(a) is a plan view of the wiring board illustrating a manufacturing process for the wiring board of FIG. 5.
Figure 7B:
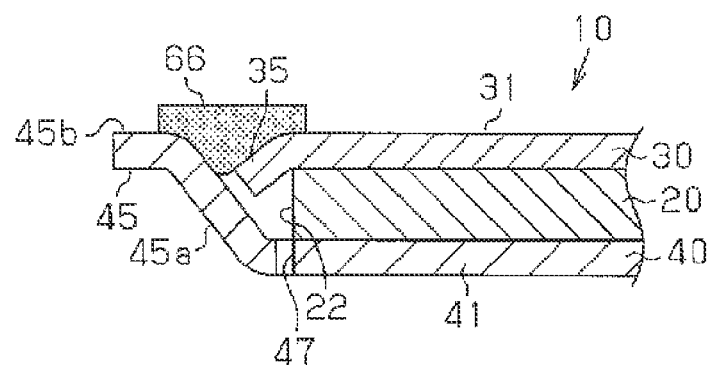
FIG. 7(b) is a cross-sectional view taken along line VII-VII in FIG. 7(a)
Figure 7C:
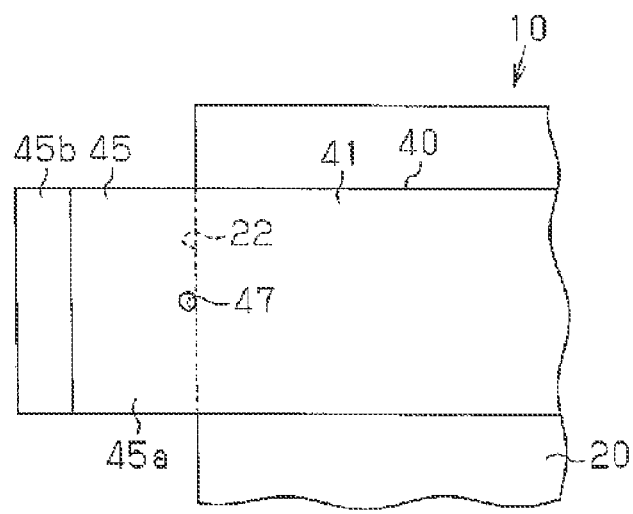
FIG. 7(c) is a bottom view of the wiring board.

Subsequently, as shown in FIG. 7, solder paste 66 is applied to a gap between the first bent portion 35 of the first copper plate 30 and the second bent portion 45 of the second copper plate 40 beside the insulative substrate 20 and its surrounding. Specifically, the wiring board 10 has a flat upper surface that forms a copper plate surface free of projections thereby allowing for the printing of solder paste to the desired region. Further, during the application process of the solder paste, a metal mask is arranged on a portion (distal side) of the upper surface of the horizontal section 45b in the second bent portion 45.

Then, heating is performed in a solder reflow furnace so that the solder 65 fills the space between the first bent portion 35 and the second bent portion 45 as shown in FIG. 5. The solder 65 also fills the through hole 47. By visually checking the solder 65 filled in the through hole 47 from the rear surface (lower surface), it may be determined whether or not soldering has been correctly performed.

Figure 8A:
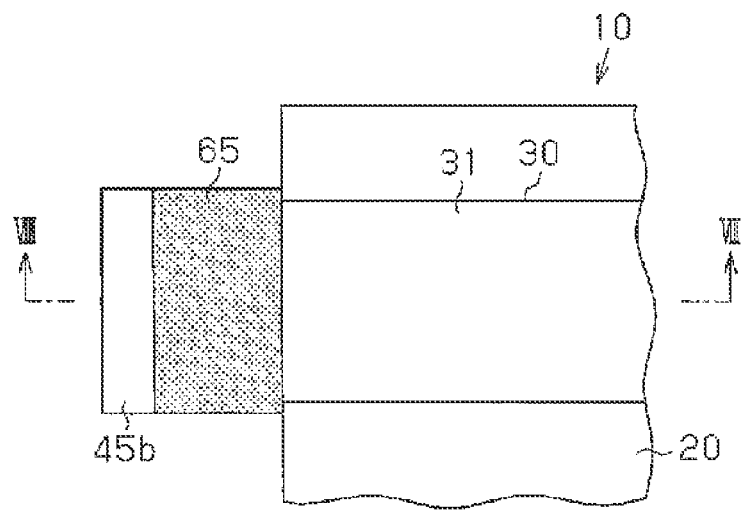
FIG. 8(a) is a plan view of the wiring board illustrating a manufacturing process for the wiring board of FIG. 5.
Figure 8B:
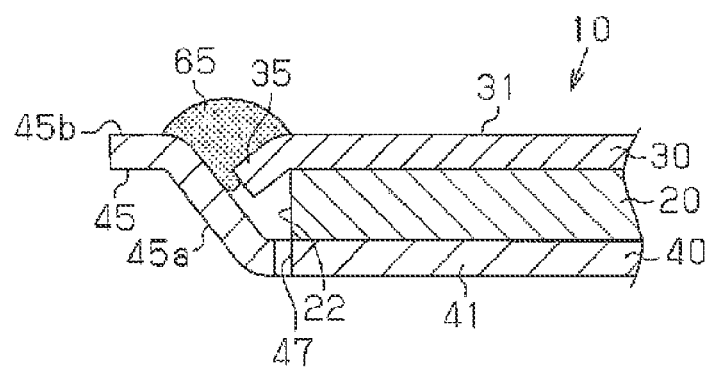
FIG. 8(b) is a cross-sectional view taken along line VIII-VIII in FIG. 8(a)
Figure 8C:
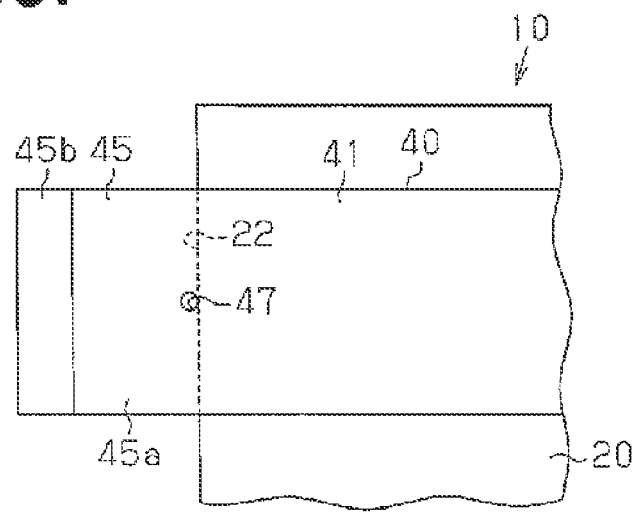
FIG. 8(c) is a bottom view of the wiring board.

FIG. 8 shows a case in which the solder 65 is not filled in the through hole 47 when filling the solder 65 between the first bent portion 35 and the second bent portion 45. In this case, the solder 65 cannot be visually checked through the through hole 47. This indicates that the soldering is defective.

The present embodiment has the advantages described below.

(5) The configuration of the wiring board includes the first copper plate 30, which serves as the first metal plate, and the second copper plate 40, which serves as the second metal plate, includes the bent portions 35 and 45, which extend from the joined portions 31 and 41 that are joined with the insulative substrate 20 serving as the base. Further, the bent portions 35 and 45 are bent toward the insulative substrate 20 and arranged to cover the side surface of the insulative substrate 20. The through hole 47 is arranged in the second copper plate 40 at a portion facing a location beside the side surface 22 of the insulative substrate 20. Further, the inner sides of the bent portions 35 and 45 including the interior of the through hole 47 are filled with the solder 65 that serves as the conductive material. This allows for a large current to flow through the conductive line connecting the front and rear sides. Additionally, the space filled with the solder 65 is small. This allows for a decrease in the amount of the filled solder 65. Moreover, the filling of the solder 65 serving as the conductive material at the inner sides of the bent portions 35 and 45 may be visually checked from the through hole 47. This allows for inspection of the conductive line.

A bent portion may be included in only one of the first copper plate 30 and the second copper plate 40. More specifically, for example, the first copper plate 30 of FIG. 5 may horizontally extend toward the outer side from the side surface 22 of the insulative substrate 20.

Third Embodiment

A third embodiment will now be described centering on differences from the first embodiment.

Figure 9A:
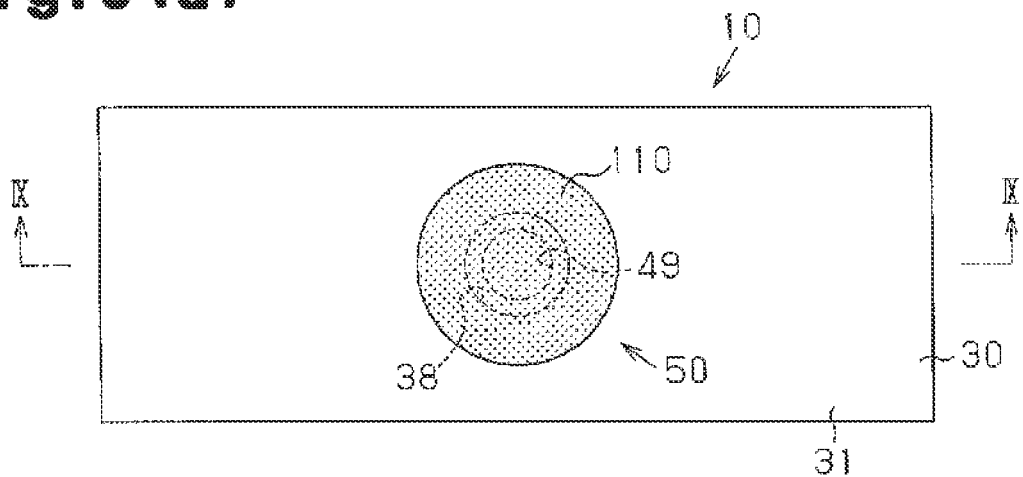
FIG. 9(a) is a plan view of a wiring board according to a third embodiment of the present invention.
Figure 9B:
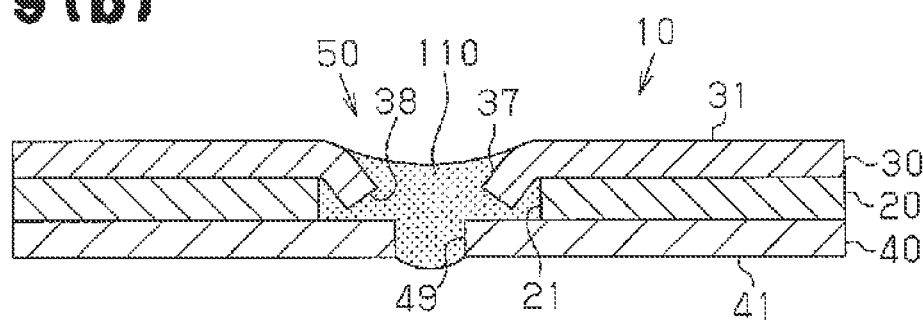
FIG. 9(b) is a cross-sectional view taken along line IX-IX in FIG. 9(a)
Figure 9C:
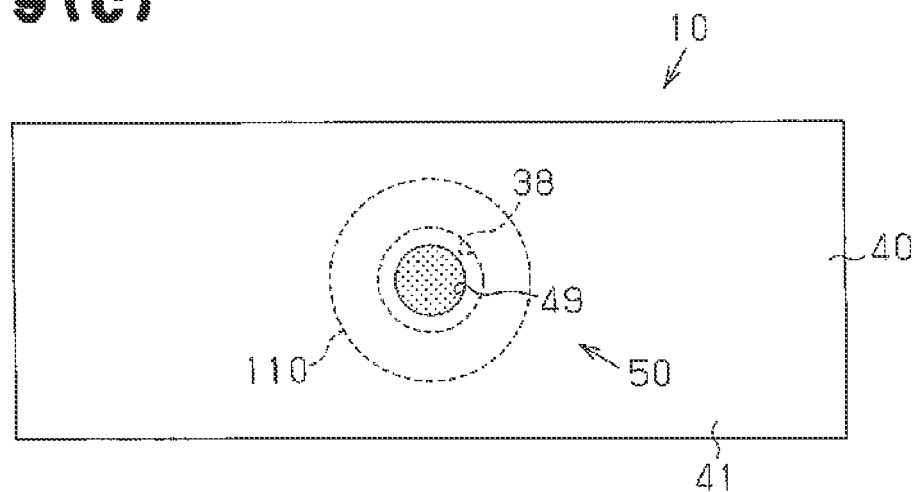
FIG. 9(c) is a bottom view of the wiring board.

As shown in FIG. 9, the first copper plate 30, which serves as the first metal plate, is adhered to the upper surface of the insulative substrate 20 and the second copper plate 40, which serves as the second metal plate, is adhered to the lower surface of the insulative substrate 20. The first copper plate 30, which is adhered to the upper surface of the insulative substrate 20, is patterned into a desired shaped to form a current line. Further, the second copper plate 40, which is adhered to the lower surface of the insulative substrate 20, is patterned into a desired shaped to form a current line.

The conductive pattern formed by the first copper plate 30 and the conductive pattern formed by the second copper plate 40 are electrically connected.

The wiring board 10 includes the conductive line 50 that electrically connects the first copper plate 30, which is joined with the front surface (upper surface) of the insulative substrate 20, and the second copper plate 40, which is joined with the rear surface (lower surface) of the insulative substrate 20 in the base through hole 21 that extends through the insulative substrate 20. The base through hole 21 is circular.

The conductive line 50 includes the first copper plate 30, the second copper plate 40, and the solder 110 that electrically connects the first copper plate 30 and the second copper plate 40. The first copper plate 30 includes a bent portion 37. The bent portion 37 extends from the first joined portion 31, which is joined with the insulative substrate 20, and bent toward the rear side (lower side) of the insulative substrate 20. The bent portion 37 extends straight and diagonally downward from the opening of the base through hole 21 and is arranged to cover the inner wall surface of the base through hole 21. Further, a through hole 38 is formed in the first bent portion 32 at a location corresponding to the central portion of the base through hole 21. The through hole 38 is circular.

The second copper plate 40 extends horizontally without being bent. A circular through hole 49 is formed in the second copper plate 40. The through hole 49 is located at the central portion of the base through hole 21. The interior of the base through hole 21 including the interior of the through hole 49 is filled with solder 110. The through hole 49 allows for gas to be released during a solder reflow process and allows for the filling of the solder 110 to be visually checked. Thus, the filling of the solder 110 may be ensured.

Figure 10A:
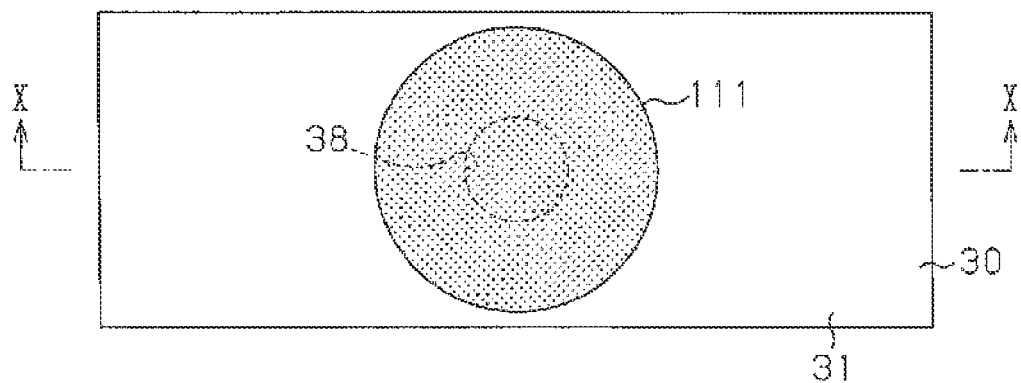
FIG. 10(a) is a plan view of the wiring board illustrating a manufacturing process for the wiring board of FIG. 9(a)
Figure 10B:
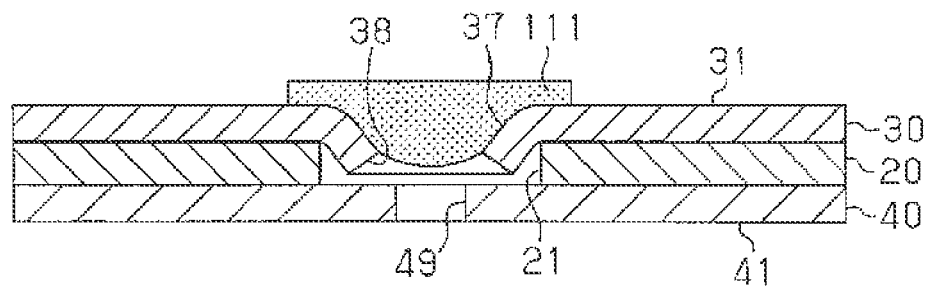
FIG. 10(b) is a cross-sectional view taken along line X-X in FIG. 10(a)
Figure 10C:
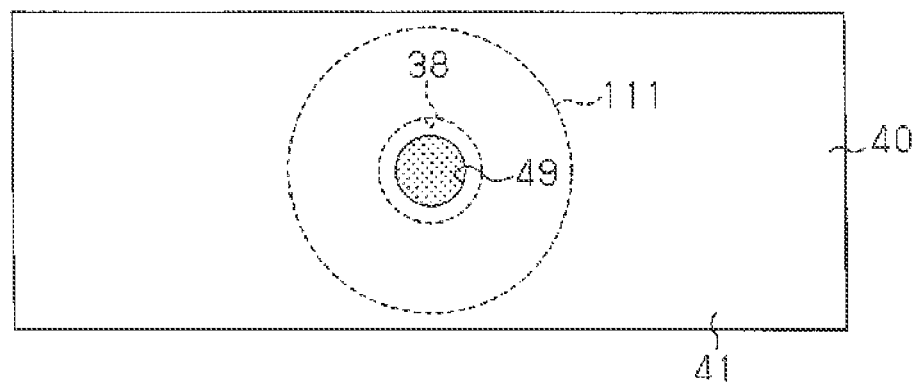
FIG. 10(c) is a bottom view of the wiring board.

More specifically, in the manufacturing process, as shown in FIG. 10, a solder paste 111 is applied to the first copper plate 30 at the region where the through hole 38 is formed and its surrounding. Then, heating is performed in a solder reflow furnace so that fluid solder flows into the region below the application region of the solder paste 111 thereby filling the space between the first bent portion 32 and the second bent portion 42 in the base through hole 21 as shown in FIG. 9. The solder 110 is also filled into the through hole 49. In this case, if there were no through hole 49, when solder melts during the solder reflow process, this would heat and increase the volume of the gas (air) trapped in the void between the solder paste 111 and the second copper plate 40. As a result, the solder paste 111 may be scattered. In this regard, the present embodiment forms the through hole 49 in the second copper plate 40. Thus, even when the gas trapped in the void between the solder paste 111 and the through hole 49 of the second copper plate 40 is heated, gas may be released through the through hole 49. By releasing gas in this manner, the solder wettability is stabilized.

Further, by visually checking the solder 110 filled in the through hole 49 from the rear surface (lower surface) of the wiring board 10, it may be recognized that the solder 110 has been sufficiently filled in the reflow process. This allows for determination of whether or not soldering has been correctly performed.

The present embodiment has the advantages described below.

(6) In the configuration of the wiring board, at least one of the first copper plate 30, which serves as the first metal plate, and the second copper plate 40, which serves as the second metal plate, includes the bent portion 37, which extends from the joined portions 31 and 41 that are joined with the insulative substrate 20 serving as the base. Further, the bent portion 37 is bent toward the insulative substrate 20 and arranged to cover the inner wall surface of the base through hole 21. Additionally, the inner side of the bent portion 37 including the interior of the through hole 49 is filled with the solder 110 serving as the conductive material. This allows for a large current to flow through the conductive line connecting the front and rear sides. Further, the space filled with the solder 110 is narrow. This allows for a decrease in the amount of the filled solder 110. Moreover, the filling of the solder 110 serving as the conductive material at the inner side of the bent portion 37 may be visually checked from the through hole 49. This allows for inspection of the conductive line. In broad terms, the through hole 49 is formed in the second copper plate 40, which serves as the second metal plate, at a portion facing the interior of the base through hole 21. Further, the through hole 49 allows for at least one of the release of gas from the base through hole 21 and the inspection of the conductive line 50 to be performed.

(7) The process for manufacturing the wiring substrate includes a metal plate joining step, an application step, and a reflow step. As shown in FIG. 10, in the metal plate joining step, the first copper plate 30, which serves as the first metal plate, is joined with the front surface of the insulative substrate 20, which serves as the base, and the second copper plate 40, which serves as the second metal plate, is joined with the rear surface of the insulative substrate 20 so as to close one opening of the base through hole 21. In the application step, solder paste 111 is applied to the other opening of the base through hole 21 in the front surface of the first copper plate 30. As shown in FIG. 9, in the reflow step, a reflow process is performed on the solder paste 111 to fill the inner side of the bent portion 37 including the interior of the through hole 49 with the solder 110, which serves as the conductive material, while releasing gas from the through hole 49 formed in a portion of the second copper plate 40 facing the interior of the base through hole 21. This obtains the wiring board shown in FIG. 9. The release of gas from the base through hole 21 in the reflow process when manufacturing the wiring board stabilizes the solder wettability.

The same applies to the through holes 43 and 44 of the first embodiment. In the reflow process described with reference to FIGS. 1 and 3, gas may be released from the base through hole 21 through the through holes 44 and 43.

Fourth Embodiment

A fourth embodiment will now be described with reference to FIGS. 11 to 14.

Figure 11:
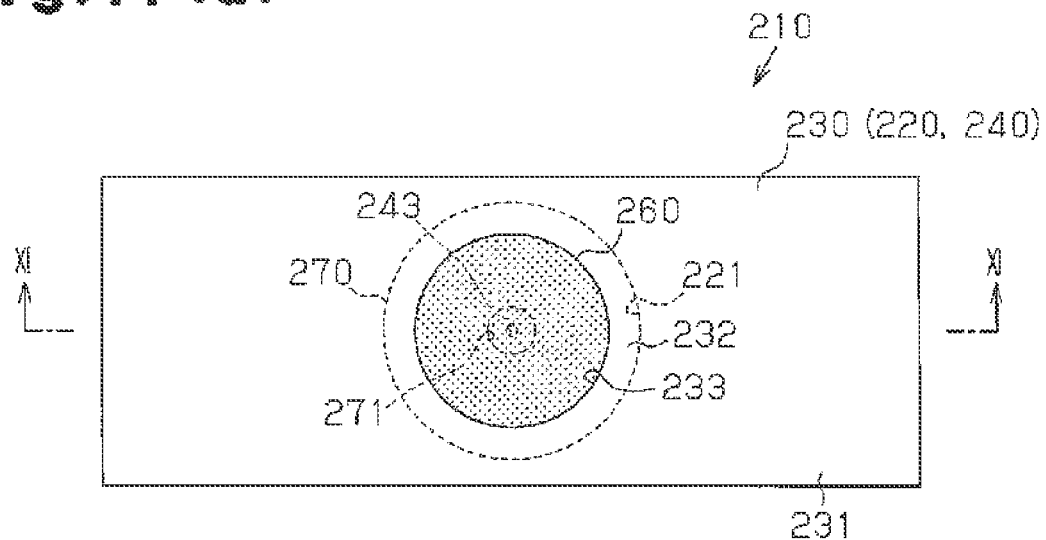
FIG. 11(a) is a plan view of a wiring board according to a fourth embodiment of the present invention.
FIG. 11(b) is a cross-sectional view taken along line XI-XI in FIG. 11(a)
FIG. 11(c) is a bottom view of the wiring board.
Figure 11:
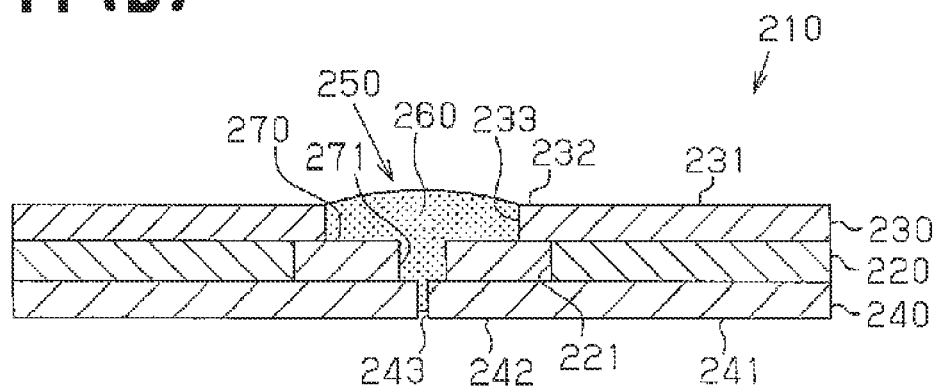
Figure 11:
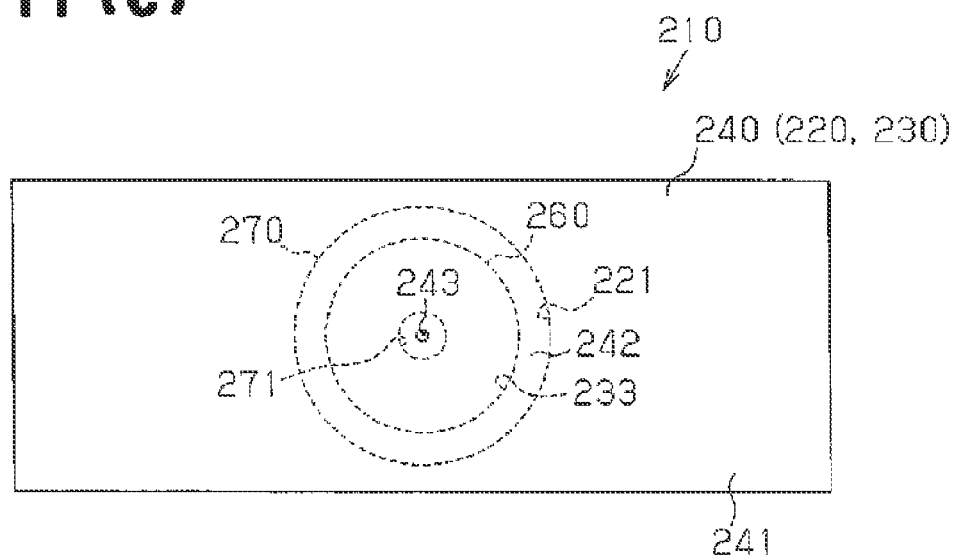
Figure 12:
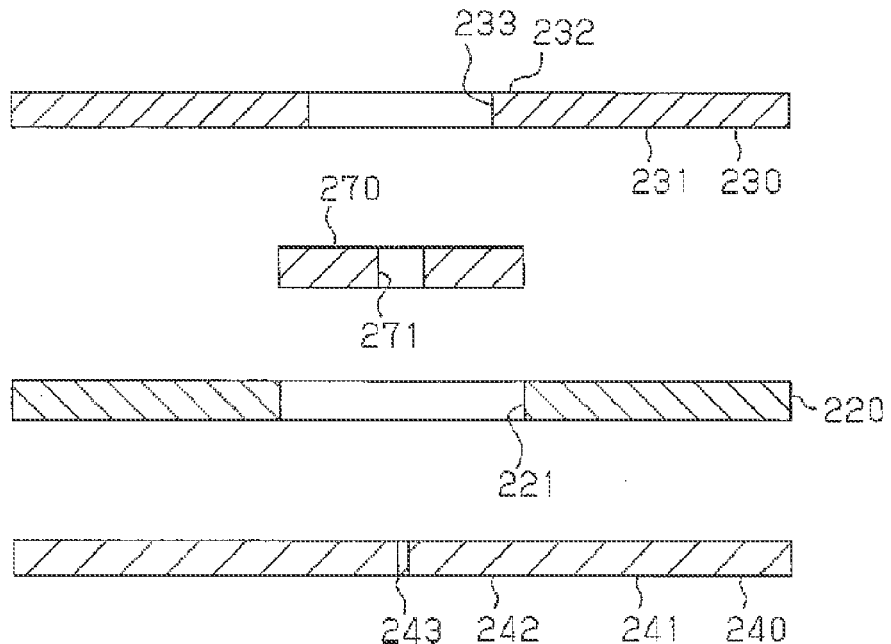
FIG. 12 is an exploded cross-sectional view of the wiring board of FIG. 11(a).

As shown in FIGS. 11 and 12, in the present embodiment, a metal plate 270 (washer) serving as a plate material is arranged in a solder supply space. The metal plate 270 (washer) allows for the solder supply space to be reduced in size. This allows for a decrease in the amount of the supplied solder and allows for solder to be smoothly applied during solder application using a mask. Further, the metal plate 270 (washer) and the arrangement of through holes 271, 233, and 243 in copper plates 230 and 240 allows for the release of gas and the checking of the filled solder through the through hole 243.

A detailed description will now be given.

A wiring board 210 is formed by a thick copper substrate. That is, the first copper plate 230, which serves as a first metal plate, is adhered to an upper surface of an insulative substrate 220, which serves as a base. Further, the second copper plate 240, which serves as a second metal plate, is adhered to a lower surface of the insulative substrate 220. The first copper plate 230 is patterned into a desired shaped to form a current line. Further, the second copper plate 240 is patterned into a desired shaped to form a current line.

More specifically, for example, a glass epoxy resin substrate may be used as the insulative substrate 220. Further, the insulative substrate 220 has a thickness of, for example, 400 µm, the first copper plate 230 has a thickness of, for example, 500 µm, and the second copper plate 240 has a thickness of, for example, 500 µm.

The configuration described below electrically connects a conductive pattern formed by the first copper plate 230 and a conductive pattern formed by the second copper plate 240.

The wiring board 210, which is formed by a thick copper substrate, includes a first copper plate 230, which is joined with the front surface (upper surface) of the insulative substrate 220, and the second copper plate 240, which is joined with the rear surface (lower surface) of the insulative substrate 220 in a base through hole 221 extending through the insulative substrate 220. The base through hole 221 is circular.

The conductive line 250 includes the first copper plate 230, the second copper plate 240, and solder 260 serving as a conductive material that electrically connects the first copper plate 230 and the second copper plate 240.

The first copper plate 230 includes a first extension 232. The first extension 232 extends horizontally into one opening of the base through hole 221 from a first joined portion 231 joined with the insulative substrate 220. Further, the first through hole 233 is formed in the first extension 232 at a portion corresponding to the central portion of the base though hole 221. The first through hole 233, which is located in one opening of the base through hole 221, is circular and smaller than the base through hole 221.

The second copper plate 240 includes a second extension 242. The second extension 242 extends horizontally into the other opening of the base through hole 221 from a second joined portion 241 joined with the insulative substrate 220. Further, the second through hole 243 is formed in the second extension 242 at a portion corresponding to the central portion of the base though hole 221. The second through hole 243, which is located in the other opening of the base through hole 221, is circular, smaller than the base through hole 221, and smaller than the first through hole 233. The second through hole 243 is arranged in the second copper plate 240 at a portion facing the interior of the base through hole 221.

A metal plate 27 (washer) is arranged in the base through hole 221 of the insulative substrate 220. The metal plate 270 is disk-shaped and engaged with the base through hole 221. Further, the third through hole 271 is formed in the central portion of the metal plate 270. The third through hole 271 is circular. The third through hole 271 is in communication with the first through hole 233 and the second through hole 243. Further, the third through hole 271 is smaller than the first through hole 233 and larger than the second through hole 243.

The interiors of the first through hole 233 and the third through hole 271 including the interior of the second through hole 243 are filled with the solder 260, which serves as the conductive material. The second through hole 243 allows for the filling of the solder 260 to be visually checked. That is, the filling of the solder 260 may be ensured.

The operation of the wiring board 210 will now be described.

In FIG. 11, the first copper plate 230 is joined with the front surface of the insulative substrate 220, and the second copper plate 240 is joined with the rear surface of the insulative substrate 220. Further, the metal plate 270 is arranged in the base through hole 221, and the interiors of the through holes 233 and 271 including the interior of the through hole 243 are filled with the solder 260. The first copper plate 230 and the second copper plate 240 are electrically connected to each other by the solder 260.

Current flows from the first copper plate 230 to the second copper plate 240. In detail, current flows from the first extension 232 via the solder 260 to the second extension 242. Here, the flow of a large current (e.g., 120 amperes) is allowed.

In this manner, by devising the shapes of the copper plates 230 and 240 at the two surfaces and performing soldering, a large current (e.g., 120 amperes) may flow between layers.

Current may flow to the metal plate 270 (washer).

A process for manufacturing the wiring board 10 will now be described.

Figure 13A:
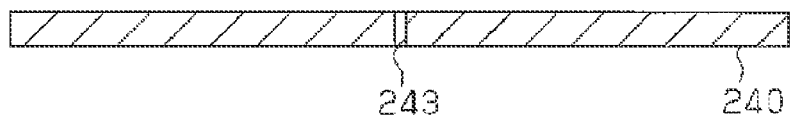
FIGS. 13(a) to 13(c) are cross-sectional views of the wiring board of FIG. 11(a) illustrating a manufacturing process for the wiring board.
Figure 13B:
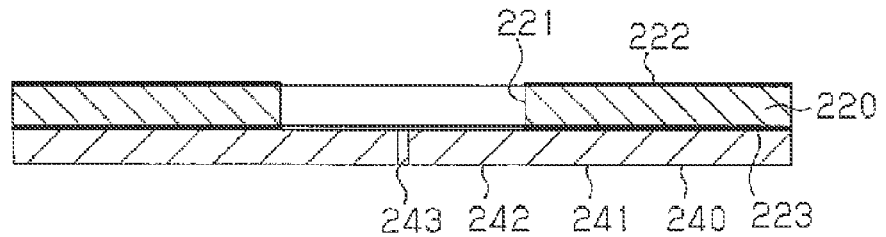

As shown in FIG. 13(a), the through hole 243 is formed in the second copper plate 240. As shown in FIG. 13(b), the base through hole 221 is formed in the insulative substrate 220, which serves as a core material, and adhesives 222 and 223 are applied to the two surfaces of the insulative substrate 220. Further, the second copper plate 240 including the through hole 243, which is located at an opening of the base through hole 221 and is smaller than the base through hole 221, is arranged on the rear surface of the insulative substrate 220.

Figure 13C:
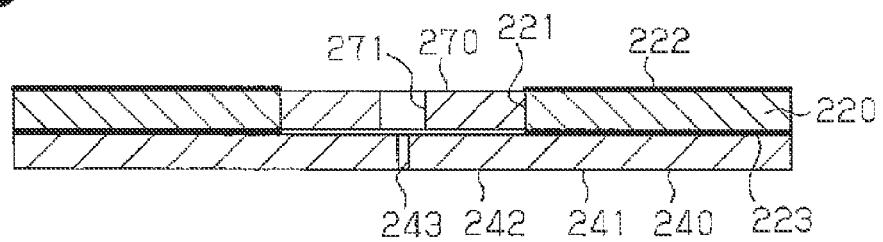

As shown in FIG. 13(c), the metal plate 270, which includes the through hole 271 that is in communication with the through hole 243 of the second copper plate 240 and larger than the through hole 243, is arranged in the base through hole 221. When arranging the metal plate 270 (washer), the metal plate 270 (washer) is just fitted. That is, the metal plate 270 (washer) is positioned at the opening of the core material (insulative substrate 220).

Figure 14A:
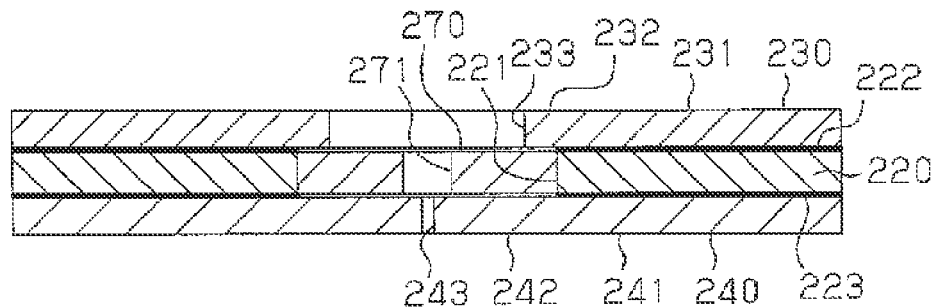
FIGS. 14(a) and 14(b) are cross-sectional views of the wiring board of FIG. 11(a) illustrating the manufacturing process for the wiring board.

As shown in FIG. 14(a), the first copper plate 230, which includes the through hole 233 that is in communication with the through hole 271 of the metal plate 270, is arranged on the front surface of the insulative substrate 220.

Figure 14B:
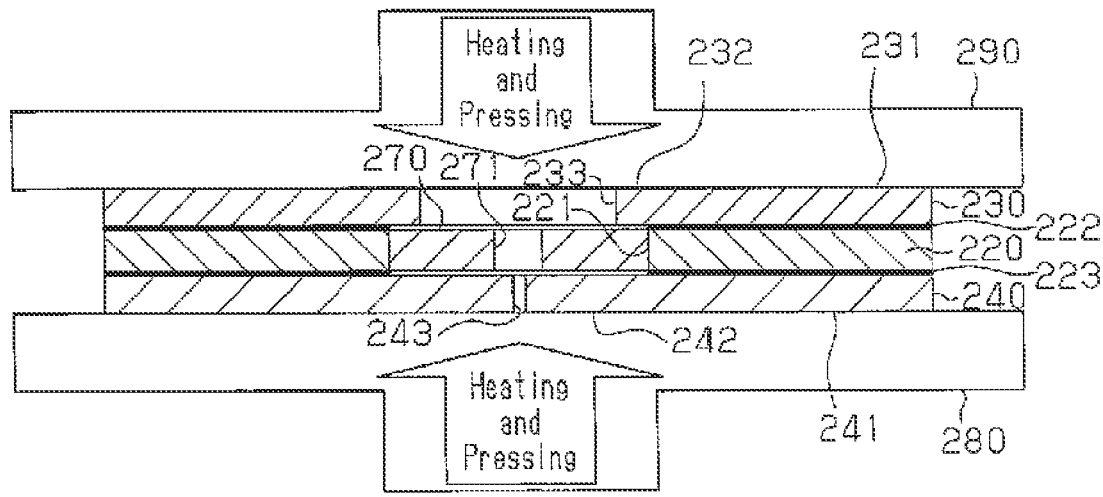

As shown in FIG. 14(b), the lamination of the insulative substrate 220 and the copper plates 230 and 240 are heated, pressed, and completely joined by upper and lower plates 280 and 290. That is, a lamination pressing machine applies heat and pressure to join the adhesives 222 and 223.

Subsequently, as shown in FIG. 11, the interiors of the through hole 233 in the first copper plate 230 and the through hole 271 in the metal plate 270 including the interior of the through hole 243 in the second copper plate 240 are filled with the solder 260 serving as the conductive material.

In detail, a solder paste is applied to the surface of the first copper plate 230 at the region where the through hole 233 is formed and its surrounding. Then, heating is performed in a solder reflow furnace so that fluid solder flows into the region below the application region of the solder paste thereby filling the interiors of the through hole 233 in the first copper plate 230 and the through hole 271 in the metal plate 270 including the interior of the through hole 243 in the second copper plate 240.

In this case, the through hole 243 is formed in the second copper plate 240. Thus, even when the gas (air) trapped in the void between the solder paste and the second copper plate 240 is heated, gas may be released through the through hole 243. The release of gas stabilizes the solder wettability. Further, by visually checking the solder 260 filled in the through hole 243 from the rear surface (lower surface) of the wiring board 210, it may be recognized that the solder 260 has been sufficiently filled in the reflow process. This allows for determination of whether or not soldering has been correctly performed.

Figure 15:
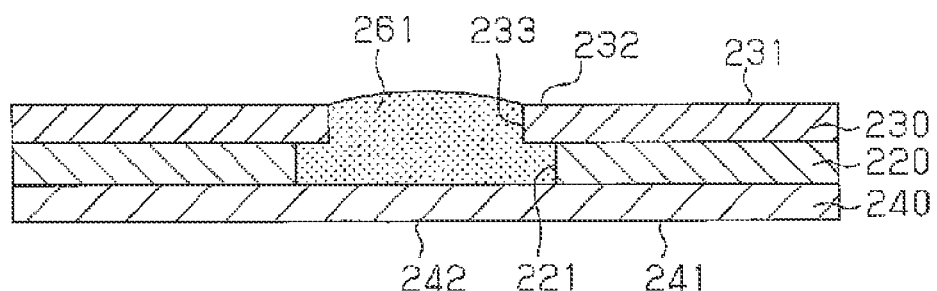
FIG. 15 is a cross-sectional view showing a wiring board for comparison.

For example, when electrically connecting layers in the case of FIG. 15, a large amount of solder is necessary. In this regard, the present embodiment shown in FIG. 11 uses the metal plate 270 (washer) to raise the height. This allows for the solder amount to be decreased.

Figure 16A:
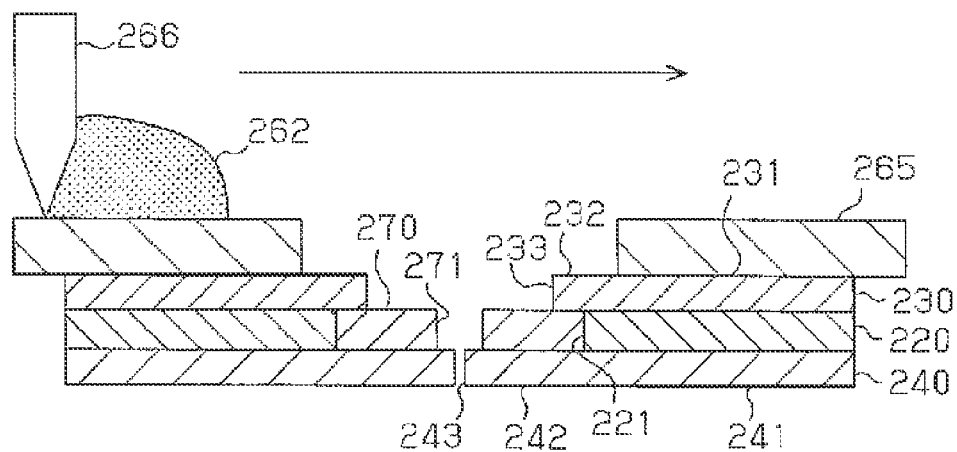
FIGS. 16(a) to 16(c) are cross-sectional views illustrating a process for applying solder paste to the wiring board of FIG. 11(a).
Figure 16B:
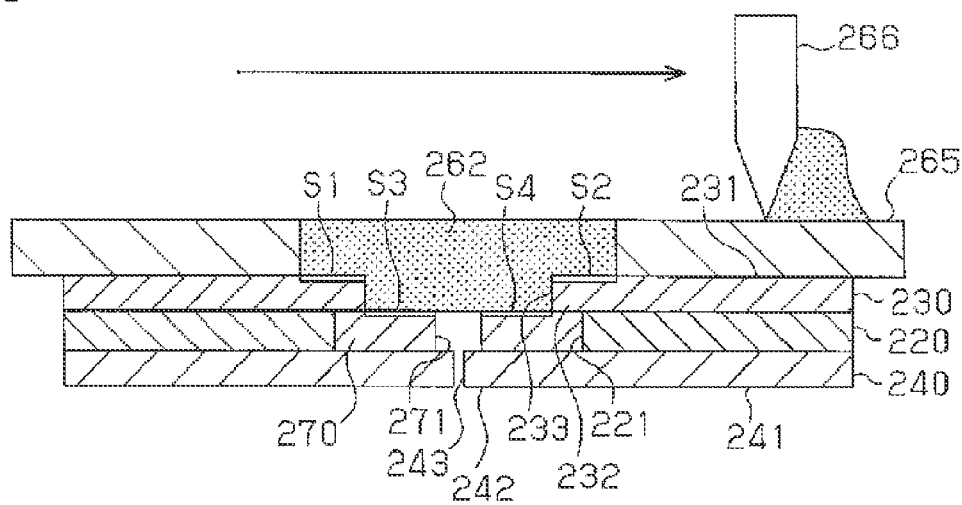
Figure 16C:
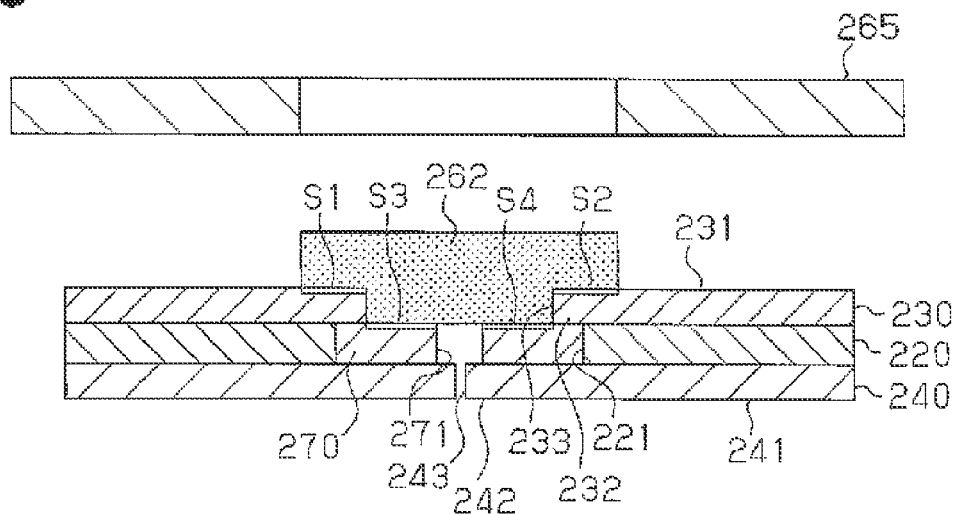
Figure 17A:
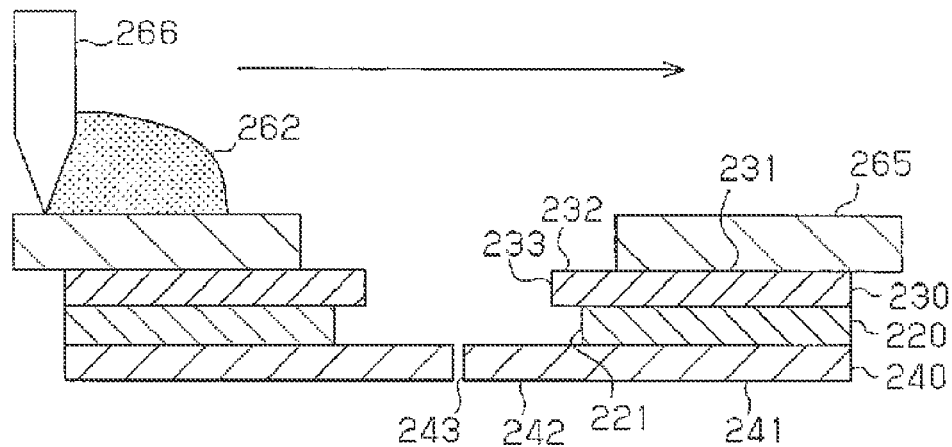
FIGS. 17(a) to 17(c) are cross-sectional views illustrating a solder paste applying process for comparison.
Figure 17B:
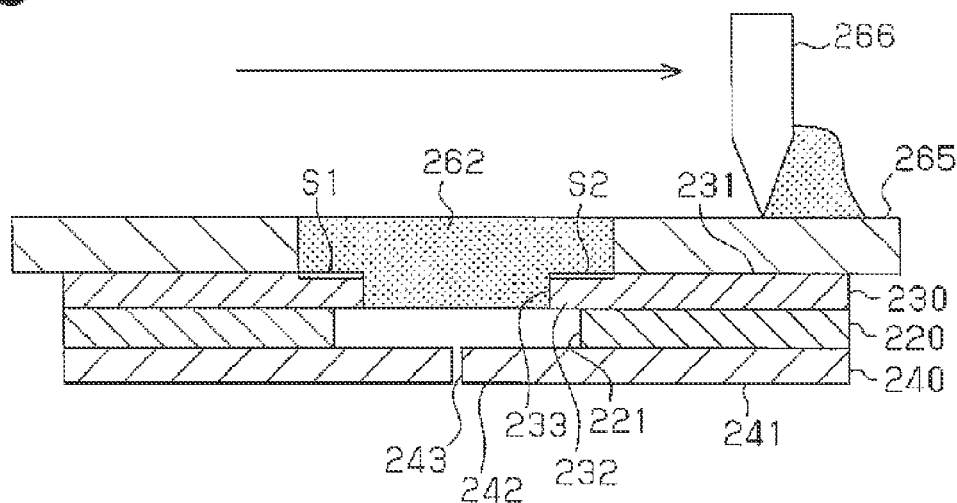
Figure 17C:
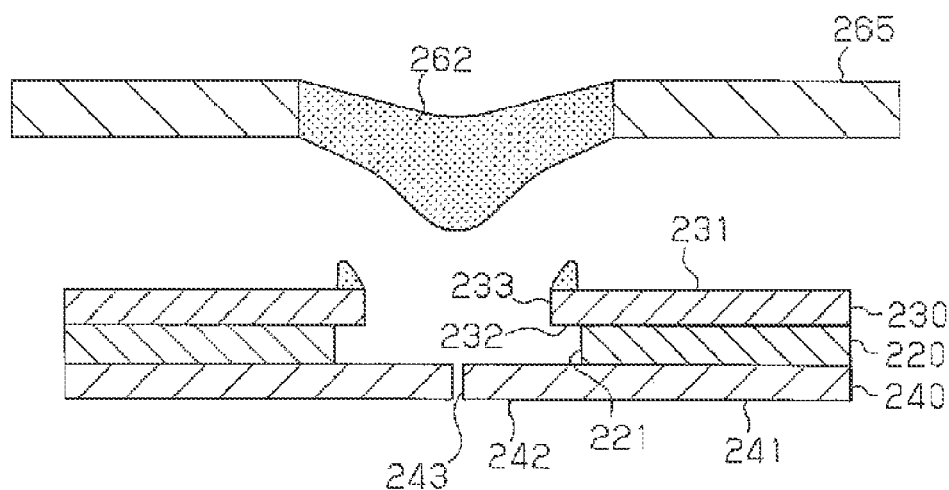

The present embodiment of FIG. 16 that uses the metal plate 270 (washer) will now be compared with a comparative example of FIG. 17 that does not use the metal plate 270 (washer). When using the metal plate 270 (washer), in FIGS. 16A, 16B, and 16C, a mask 265 is arranged, and a solder paste 262 is applied to the desired region by a squeegee 266. Here, as shown in FIG. 16(b), the force of flux adheres the solder paste 262 to substrate side surfaces S1, S2, S3, and S4. As shown in FIG. 16(c), when removing the mask 265, the solder paste 262 is cleanly separated from the mask 265. In the case of FIG. 17 that does not use the metal plate 270 (mask), as shown in FIG. 17(b), the adhering surfaces of the solder paste 262 forms S1 and S2. This decreases the adhering surfaces and lowers the adhesive force of the solder paste 262. Thus, when removing the mask 265, as shown in FIG. 17(c), the solder paste 262 may adhere to the mask 265 such that the solder paste does not remain on the substrate.

In this manner, in a solder paste application process, solder paste adheres to the metal plate 27 (washer). Thus, when removing the mask, the adhesion of the solder paste to the mask is obviated.

Further, in the lower second copper plate 240 shown in FIG. 11, the through hole 243 is arranged at a portion corresponding to the central portion of the base through hole 221. The through hole 243 may be used to release air (gas) or be used as a window used to check the filled amount of solder.

The first extension 232 may be omitted from the first copper plate 230.

The present embodiment obtains the advantages described below.

(8) As the structure of the wiring board, the second copper plate 240 includes the second extension 242, which extends into the opening of the base through hole 221 from the joined portion 241 joined with the insulative substrate 220. The metal plate 270 including the through hole 271 is arranged in the base through hole 221, and the interior of the through hole 271 in the metal plate 270 is filled with the solder 260, which serves as the conductive material. This allows for a large current to flow through the conductive line 250 connected the front and rear sides.

Further, the metal plate 270 arranged in the space filled by the solder 260 reduces the size of the space filled with the solder 260. This allows for a decrease in the amount of the filled solder 260.

(9) The extension 242 of the second copper plate 240 includes the through hole 243 that is in communication with the through hole 271 of the metal plate 270. The through hole 243 allows for at least one of the release of gas from the base through hole 221 (through hole 271) and the inspection of the conductive line to be performed.

(10) The first copper plate 230 includes the first extension 232, which extends from the joined portion 231 joined with the insulative substrate 220 to the opening of the base through hole 221 and which includes the through hole 233 that is smaller than the base through hole 221. The metal plate 270, which includes the through hole 271 that is in communication with the through hole 233 of the first copper plate 230, is arranged in the base through hole 221.

The interiors of the through hole 233 in the first copper plate 230 and the through hole 271 in the metal plate 270 are filled with the solder 260, which serves as the conductive material. Thus, the metal plate 270 is preferable for positioning.

(11) The process for manufacturing the wiring board includes a second metal plate arrangement step, a plate material arrangement step, a first metal plate arrangement step, and a solder filling step. In the second metal plate arrangement step, the second copper plate 240, which is located in the opening of the base through hole 221 and includes the through hole 243 that is smaller than the base through hole 221, is arranged on the rear surface of the insulative substrate 220. In the plate material arrangement step, the metal plate 270, which includes the through hole 271 that is in communication with the through hole 243 of the second copper plate 240 and is larger than the through hole 243 of the second copper plate 240, is arranged in the base through hole 221. In the first metal plate arrangement step, the first copper plate 230, which includes the through hole 233 that is in communication with the through hole 271 of the metal plate 270, is arranged on the front surface of the insulative substrate 220. In the solder filling step, the interiors of the through hole 233 in the first copper plate 230 and the through hole 271 in the metal plate 270 including the interior of the through hole 243 in the second copper plate 240 are filled with the solder 260, which serves as the conductive material. This allows for the wiring board of (10) to be obtained.

Modified examples of the present embodiment will now be described.

Figure 18A:
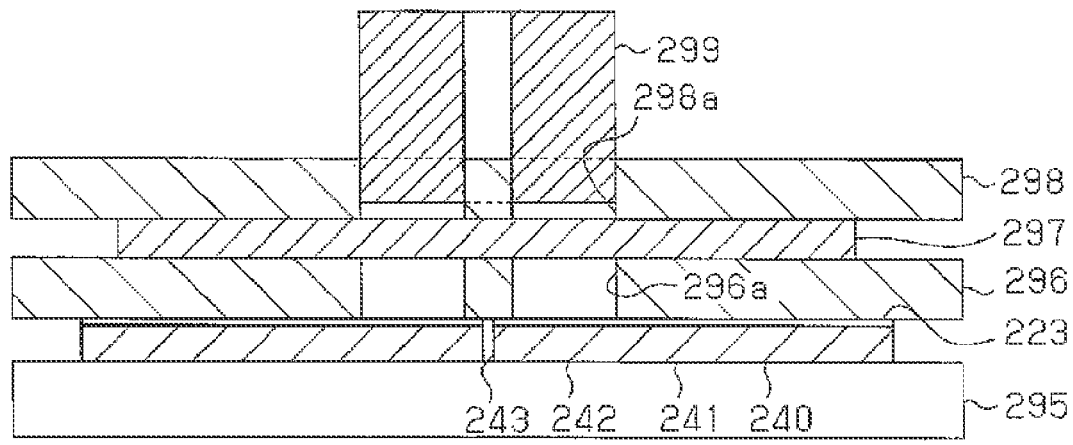
FIGS. 18(a) to 18(c) are cross-sectional views illustrating a manufacturing process for a modified example.
Figure 18B:
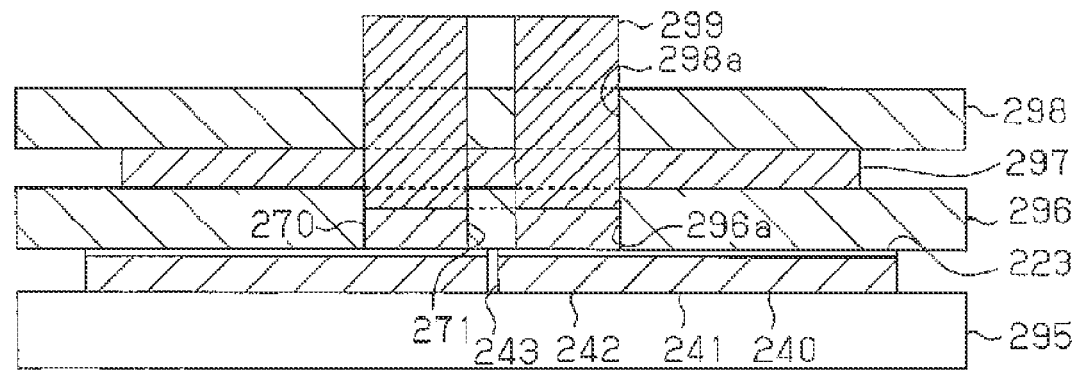
Figure 18C:
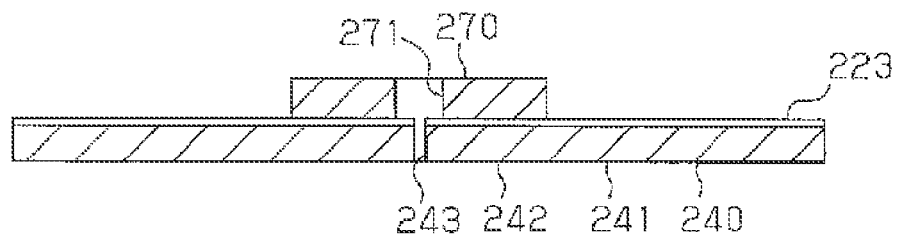
Figure 19:
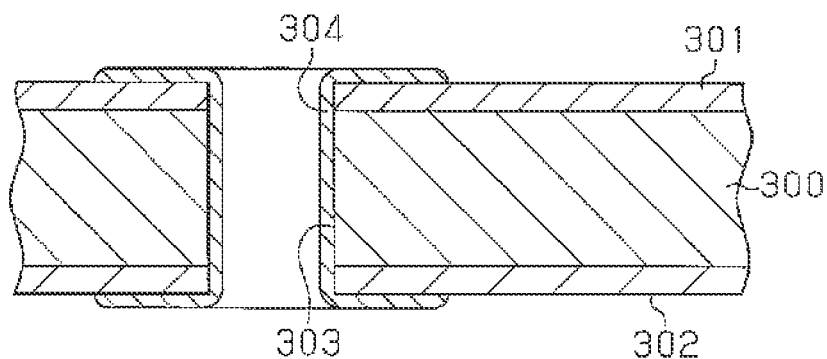
FIG. 19 is a cross-sectional view of a prior art wiring board.

As shown in FIG. 18(*c*), the metal plate 270 (washer), which includes the through hole 271, may be adhered onto the second copper plate 240. In detail, as shown in FIG. 18(*a*), the second copper plate 240 is arranged on a stage 295, and an adhesive 223 is applied to the upper surface of the second copper plate 240. A die 296 is arranged on the second copper plate 240, and the die 296 includes a die hole 296*a*. A metal plate 297 prior to processing is arranged on the die 296, and a stripper 298 is arranged on the metal plate 297. The stripper 298 includes a stripper hole 298*a*. The stripper hole 298*a* receives a punch 299.

The punch 299 is lowered into the stripper hole 298*a* to punch out the metal plate 197 as shown in FIG. 18(*b*) and form the metal plate 270 (washer), which includes the through hole 271. Further, the punch 299 is lowered into the die hole 296*a* to press the punched out washer (metal plate 270 including through hole 271) against the adhesive 223.

Subsequently, the punch 299 is raised, and the die 296 is raised. As shown in FIG. 18(*c*), this adheres the metal plate 270 (washer) including the through hole 271 onto the second copper plate 240.

Then, as shown in FIG. 13(*c*), the insulative substrate 220, which includes the base through hole 221, is adhered onto the second copper plate 240.

As illustrated in FIG. 18, the washer (metal plate 270 including through hole 271) is adhered to the upper surface of the second copper plate 240. Burrs are formed when the metal plate is punched out. However, the burrs are caught in the adhesive 223. This further increases the adhesive strength.

In this case, it is preferable that the adhesive 223 be conductive. Further, in FIG. 18(*a*), the through hole 271 does not have to be formed beforehand in the metal plate 297.

The embodiments are not limited to the foregoing description and may take the following forms.

The wiring boards 10 and 210 do not have to be formed by thick copper substrates. For example, instead of a copper plate, a metal plate such as an aluminum plate may be used.

Instead of using solder as the conductive material, a different metal having a low melting point may be used.

There is no restriction to the bending angle of the first bent portion 32, the bending angle of the second bent portion 42 (diagonal section 42*a*), the bending angle of the first bent portion 35, and the bending angle of the second bent portion 45 (diagonal section 45*a*).

There is no limit to the number of through holes formed in the second metal plate. For example, one to four holes may be formed. When there is a plurality of through holes, the through holes may be arranged in equal angular intervals.

In the first to third embodiments, a metal plate that includes a bent portion may be extended from a joined portion joined with the base, and a metal plate that does not include a bent portion does not have to be extended from a joined portion joined with the base.

DESCRIPTION OF REFERENCE CHARACTERS

10: wiring board, 20: insulative substrate, 21: base through hole, 22: side surface, 30: first copper plate, 31: first joined portion, 32: first bent portion, 33: through hole, 35: first bent portion, 37: bent portion, 40: second copper plate, 41: second joined portion, 42: second bent portion, 43: through hole, 44: through hole, 45: second bent portion, 47: through hole, 49: through hole, 50: conductive line, 55: conductive line, 60: solder, 65: solder, 110: solder, 210: wiring board, 220: insulative substrate, 221: base through hole, 230: first copper plate, 231: first joined portion, 232: first extended portion, 233: first through hole, 240: second copper plate, 241: second joined portion, 242: second extended portion, 243: second through hole, 250: conductive line, 260: solder, 270: metal plate, 271: third through hole

The invention claimed is:

1. A wiring board comprising:
   a base including a front surface, a rear surface, and a side surface;
   a first metal plate joined with the front surface;
   a second metal plate joined with the rear surface; and
   a conductive line configured to electrically connect the first metal plate and the second metal plate, wherein the conductive line is arranged in an inner space defined by an inner wall surface of a base through hole formed in the base or an outer space located at an outer side of the side surface of the base, and the conductive line includes the first metal plate, the second metal plate, and a conductive material electrically connecting the first metal plate and the second metal plate,
   wherein at least one of the first metal plate and the second metal plate includes a joined portion, which is joined with the base, and a bent portion, which is bent and extended from the joined portion to cover the inner wall surface or the side surface, and
   the conductive material fills an inner side of the bent portion,
   wherein the second metal plate includes a through hole in a portion facing toward the inner space or the outer space, and wherein the first metal plate includes through hole formed in the bent portion of the first metal plate at a location corresponding to the base hole.

2. The wiring board according to claim 1, wherein
   the first metal plate includes a first joined portion, which serves as the joined portion, and a first bent portion, which serves as the bent portion, and the first bent portion is bent toward the rear surface;
   the second metal plate includes a second joined portion, which serves as the joined portion, and a second bent portion, which serves as the bent portion, and the second bent portion is bent toward the front surface to cover the inner wall surface or the side surface together with the first bent portion; and
   the conductive material is filled between the first bent portion and the second bent portion.

3. A wiring board comprising;
a base including a front surface, a rear surface, and a side surface;
a first metal plate joined with the front surface;
a second metal plate joined with the rear surface; and
a conductive line configured to electrically connect the first metal plate and the second metal plate, wherein the conductive line is arranged in an inner space defined by an inner wall surface of a base through hole formed in the base or an outer space located at an outer side of the side surface of the base, and the conductive line includes the first metal plate, the second metal plate, and a conductive material electrically connecting the first metal plate and the second metal plate,
wherein at least one of the first metal plate and the second metal plate includes a joined portion, which is joined with the base, and a bent portion, which is bent and extended from the joined portion to cover the inner wall surface or the side surface, and
the conductive material fills an inner side of the bent portion, wherein
the first metal plate includes a first joined portion, which serves as the joined portion, and a first bent portion, which serves as the bent portion, and the first bent portion is bent toward the rear surface;
the second metal plate includes a second joined portion, which serves as the joined portion, and a second bent portion, which serves as the bent portion, and the second bent portion is bent toward the front surface to cover the inner wall surface or the side surface together with the first bent portion; and
the conductive material is filled between the first bent portion and the second bent portion,
wherein
the conductive line is arranged in the inner space;
the first bent portion is bent toward the inner space from an open end of the base through hole that opens in the front surface, and the first bent portion includes a through hole in a portion corresponding to a central portion of the base through hole; and
the second bent portion is bent toward the inner space from an open end of the base through hole that opens in the rear surface, and the second bent portion is inserted into the through hole of the first bent portion.

4. A wiring board comprising:
a base including a front surface, a rear surface, and a side surface;
a first metal plate joined with the front surface;
a second metal plate joined with the rear surface; and
a conductive line configured to electrically connect the first metal plate and the second metal plate, wherein the conductive line is arranged in an inner space defined by an inner wall surface of a base through hole formed in the base or an outer space located at an outer side of the side surface of the base, and the conductive line includes the first metal plate, the second metal plate, and a conductive material electrically connecting the first metal plate and the second metal plate,
wherein at least one of the first metal plate and the second metal plate includes a joined portion, which is joined with the base, and a bent portion, which is bent and extended from the joined portion to cover the inner wall surface or the side surface, and
the conductive material fills an inner side of the bent portion,
wherein the second metal plate includes a through hole in a portion facing toward the inner space or the outer space,
wherein the through hole formed in the second metal plate is one of a plurality of through holes arranged on a circumference extending about a center axis of the base through hole, which has a circular cross-section.

5. The wiring board according to claim 4, wherein the through holes formed in the second metal plate are arranged at equal angular intervals.

* * * * *